(12) United States Patent
Narayanan et al.

(10) Patent No.: US 10,290,801 B2
(45) Date of Patent: May 14, 2019

(54) SCALABLE SILICON BASED RESISTIVE MEMORY DEVICE

(71) Applicant: Crossbar, Inc., Santa Clara, CA (US)

(72) Inventors: Sundar Narayanan, Cupertino, CA (US); Steve Maxwell, Sunnyvale, CA (US); Natividad Vasquez, Jr., San Francisco, CA (US); Harry Yue Gee, Santa Clara, CA (US)

(73) Assignee: CROSSBAR, INC., Santa Clara, CA (US)

( * ) Notice: Subject to any disclaimer, the term of this patent is extended or adjusted under 35 U.S.C. 154(b) by 0 days.

(21) Appl. No.: 14/613,585

(22) Filed: Feb. 4, 2015

(65) Prior Publication Data

US 2015/0228893 A1 Aug. 13, 2015

Related U.S. Application Data

(60) Provisional application No. 61/937,417, filed on Feb. 7, 2014.

(51) Int. Cl.
*H01L 45/00* (2006.01)
*H01L 27/24* (2006.01)

(52) U.S. Cl.
CPC ........ *H01L 45/1233* (2013.01); *H01L 27/249* (2013.01); *H01L 27/2436* (2013.01); *H01L 27/2463* (2013.01); *H01L 45/085* (2013.01); *H01L 45/124* (2013.01); *H01L 45/1226* (2013.01); *H01L 45/1266* (2013.01);
(Continued)

(58) Field of Classification Search
CPC ............... H01L 45/085; H01L 45/1233; H01L 45/1273; H01L 45/1226
See application file for complete search history.

(56) References Cited

U.S. PATENT DOCUMENTS

| 680,652 | A | 8/1901 | Elden |
| 4,433,468 | A | 2/1984 | Kawamata |
| 4,684,972 | A | 8/1987 | Owen et al. |

(Continued)

FOREIGN PATENT DOCUMENTS

| CN | 101131872 | 2/2008 |
| CN | 101131872 A | 2/2008 |

(Continued)

OTHER PUBLICATIONS

International Search Report and Written Opinion for Application No. PCT/US2011/040362, dated Jan. 19, 2012, 7 pages.

(Continued)

*Primary Examiner* — Mark V Prenty
(74) *Attorney, Agent, or Firm* — Wegman, Hessler & Vanderburg

(57) ABSTRACT

A memory cell that includes a first metal layer formed over a substrate is provided. The substrate includes one or more complementary metal-oxide semiconductor devices. The memory cell also includes a via device that connects at least a portion of the first metal layer and at least another portion of a second metal layer. The first metal layer has a first thickness having an edge thereof that serves as an electrode for a memory cell formed by the via device. The memory cell scales as a function of the first thickness and at least in part independent of a minimum feature size of the memory device.

20 Claims, 10 Drawing Sheets

(52) U.S. Cl.
CPC .......... *H01L 45/145* (2013.01); *H01L 45/146* (2013.01); *H01L 45/16* (2013.01)

(56) References Cited

U.S. PATENT DOCUMENTS

| | | |
|---|---|---|
| 4,741,601 A | 5/1988 | Saito |
| 4,994,866 A | 2/1991 | Awano |
| 5,139,911 A | 8/1992 | Yagi et al. |
| 5,242,855 A | 9/1993 | Oguro |
| 5,278,085 A | 1/1994 | Maddox, III et al. |
| 5,315,131 A | 5/1994 | Kishimoto et al. |
| 5,335,219 A | 8/1994 | Ovshinsky et al. |
| 5,360,981 A | 11/1994 | Owen et al. |
| 5,457,649 A | 10/1995 | Eichman et al. |
| 5,499,208 A | 3/1996 | Shoji |
| 5,538,564 A | 7/1996 | Kaschmitter |
| 5,541,869 A | 7/1996 | Rose et al. |
| 5,594,363 A | 1/1997 | Freeman et al. |
| 5,596,214 A | 1/1997 | Endo |
| 5,614,756 A | 3/1997 | Forouhi et al. |
| 5,627,451 A | 5/1997 | Takeda |
| 5,645,628 A | 7/1997 | Endo et al. |
| 5,673,223 A | 9/1997 | Park |
| 5,707,487 A | 1/1998 | Hori et al. |
| 5,714,416 A | 2/1998 | Eichman et al. |
| 5,751,012 A | 5/1998 | Wolstenholme et al. |
| 5,763,898 A | 6/1998 | Forouhi et al. |
| 5,840,608 A | 11/1998 | Chang |
| 5,900,644 A | 5/1999 | Ying et al. |
| 5,923,587 A | 7/1999 | Choi |
| 5,970,332 A | 10/1999 | Pruijmboom et al. |
| 5,973,335 A | 10/1999 | Shannon |
| 5,998,244 A | 12/1999 | Wolstenholme et al. |
| 6,002,268 A | 12/1999 | Sasaki et al. |
| 6,037,204 A | 3/2000 | Chang et al. |
| 6,122,318 A | 9/2000 | Yamaguchi et al. |
| 6,128,214 A | 10/2000 | Kuekes et al. |
| 6,143,642 A | 11/2000 | Sur, Jr. et al. |
| 6,180,998 B1 | 1/2001 | Crafts |
| 6,181,587 B1 | 1/2001 | Kuramoto et al. |
| 6,181,597 B1 | 1/2001 | Nachumovsky |
| 6,259,116 B1 | 7/2001 | Shannon |
| 6,288,435 B1 | 9/2001 | Mei et al. |
| 6,291,836 B1 | 9/2001 | Kramer et al. |
| 6,436,765 B1 | 8/2002 | Liou et al. |
| 6,436,818 B1 | 8/2002 | Hu et al. |
| 6,489,645 B1 | 12/2002 | Uchiyama |
| 6,492,694 B2 | 12/2002 | Noble et al. |
| 6,511,862 B2 | 1/2003 | Hudgens et al. |
| 6,552,932 B1 | 4/2003 | Cernea |
| 6,627,530 B2 | 9/2003 | Li et al. |
| 6,724,186 B2 | 4/2004 | Jordil |
| 6,731,535 B1 | 5/2004 | Ooishi et al. |
| 6,740,921 B2 | 5/2004 | Matsuoka et al. |
| 6,762,474 B1 | 7/2004 | Mills, Jr. |
| 6,768,157 B2 | 7/2004 | Krieger et al. |
| 6,815,286 B2 | 11/2004 | Krieger et al. |
| 6,816,405 B1 | 11/2004 | Lu et al. |
| 6,821,879 B2 | 11/2004 | Wong |
| 6,838,720 B2 | 1/2005 | Krieger et al. |
| 6,848,012 B2 | 1/2005 | Leblanc et al. |
| 6,849,891 B1 | 2/2005 | Hsu et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,867,618 B2 | 3/2005 | Li et al. |
| 6,881,994 B2 | 4/2005 | Lee et al. |
| 6,897,519 B1 | 5/2005 | Dosluoglu |
| 6,927,430 B2 | 8/2005 | Hsu |
| 6,939,787 B2 | 9/2005 | Ohtake et al. |
| 6,946,719 B2 | 9/2005 | Petti et al. |
| 6,977,181 B1 | 12/2005 | Ralberg |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,087,454 B2 | 8/2006 | Campbell et al. |
| 7,102,150 B2 | 9/2006 | Harshfield et al. |
| 7,122,853 B1 | 10/2006 | Gaun et al. |
| 7,167,387 B2 | 1/2007 | Sugita et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,238,994 B2 | 7/2007 | Chen et al. |
| 7,251,152 B2 | 7/2007 | Roehr |
| 7,254,053 B2 | 8/2007 | Krieger et al. |
| 7,274,587 B2 | 9/2007 | Yasuda |
| 7,289,353 B2 | 10/2007 | Spitzer et al. |
| 7,324,363 B2 | 1/2008 | Kerns et al. |
| 7,345,907 B2 | 3/2008 | Scheuerlein |
| 7,365,411 B2 | 4/2008 | Campbell |
| 7,405,418 B2 | 7/2008 | Happ et al. |
| 7,426,128 B2 | 9/2008 | Scheuerlein |
| 7,433,253 B2 | 10/2008 | Gogl et al. |
| 7,460,389 B2 | 12/2008 | Hsu et al. |
| 7,474,000 B2 | 1/2009 | Scheuerlein et al. |
| 7,479,650 B2 | 1/2009 | Gilton |
| 7,499,355 B2 | 3/2009 | Scheuerlein et al. |
| 7,515,454 B2 | 4/2009 | Symanczyk |
| 7,521,705 B2 | 4/2009 | Liu |
| 7,534,625 B2 | 5/2009 | Karpov et al. |
| 7,541,252 B2 | 6/2009 | Eun et al. |
| 7,550,380 B2 | 6/2009 | Elkins et al. |
| 7,561,461 B2 | 7/2009 | Nagai et al. |
| 7,566,643 B2 | 7/2009 | Czubatyi et al. |
| 7,571,012 B2 | 8/2009 | Gibson |
| 7,606,059 B2 | 10/2009 | Toda |
| 7,615,439 B1 | 11/2009 | Schricker et al. |
| 7,629,198 B2 | 12/2009 | Kumar et al. |
| 7,667,442 B2 | 2/2010 | Itoh |
| 7,692,959 B2 | 4/2010 | Krusin-Elbaum et al. |
| 7,704,788 B2 | 4/2010 | Youn et al. |
| 7,719,001 B2 | 5/2010 | Nomura et al. |
| 7,728,318 B2 | 6/2010 | Raghuram et al. |
| 7,729,158 B2 | 6/2010 | Toda et al. |
| 7,746,601 B2 | 6/2010 | Sugiyama et al. |
| 7,746,696 B1 | 6/2010 | Paak |
| 7,749,805 B2 | 7/2010 | Pinnow et al. |
| 7,764,536 B2 | 7/2010 | Luo et al. |
| 7,772,581 B2 | 8/2010 | Lung |
| 7,776,682 B1 | 8/2010 | Nickel et al. |
| 7,778,063 B2 | 8/2010 | Brubaker et al. |
| 7,786,464 B2 | 8/2010 | Nirschl et al. |
| 7,786,589 B2 | 8/2010 | Matsunaga et al. |
| 7,791,060 B2 | 9/2010 | Aochi et al. |
| 7,824,956 B2 | 11/2010 | Schricker et al. |
| 7,829,875 B2 | 11/2010 | Scheuerlein |
| 7,830,698 B2 | 11/2010 | Chen et al. |
| 7,830,700 B2 | 11/2010 | Chen et al. |
| 7,835,170 B2 | 11/2010 | Bertin et al. |
| 7,858,468 B2 | 12/2010 | Liu et al. |
| 7,859,884 B2 | 12/2010 | Scheuerlein |
| 7,869,253 B2 | 1/2011 | Liaw et al. |
| 7,875,871 B2 | 1/2011 | Kumar et al. |
| 7,881,097 B2 | 2/2011 | Hosomi et al. |
| 7,883,964 B2 | 2/2011 | Goda et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,927,472 B2 | 4/2011 | Takahashi et al. |
| 7,968,419 B2 | 6/2011 | Li et al. |
| 7,972,897 B2 | 7/2011 | Kumar et al. |
| 7,984,776 B2 | 7/2011 | Sastry et al. |
| 8,004,882 B2 | 8/2011 | Katti et al. |
| 8,018,760 B2 | 9/2011 | Muraoka et al. |
| 8,021,897 B2 | 9/2011 | Sills et al. |
| 8,045,364 B2 | 10/2011 | Schloss et al. |
| 8,048,755 B2 | 11/2011 | Sandhu et al. |
| 8,054,674 B2 | 11/2011 | Tamai et al. |
| 8,054,679 B2 | 11/2011 | Nakai et al. |
| 8,067,815 B2 | 11/2011 | Chien et al. |
| 8,068,920 B2 | 11/2011 | Gaudiani |
| 8,071,972 B2 | 12/2011 | Lu et al. |

(56) References Cited

U.S. PATENT DOCUMENTS

| | | |
|---|---|---|
| 8,084,830 B2 | 12/2011 | Kanno et al. |
| 8,088,688 B1 | 1/2012 | Herner |
| 8,097,874 B2 | 1/2012 | Venkatasamy et al. |
| 8,102,018 B2 | 1/2012 | Bertin et al. |
| 8,102,698 B2 | 1/2012 | Scheuerlein |
| 8,143,092 B2 | 3/2012 | Kumar et al. |
| 8,144,498 B2 | 3/2012 | Kumar et al. |
| 8,164,948 B2 | 4/2012 | Katti et al. |
| 8,168,506 B2 | 5/2012 | Herner |
| 8,183,553 B2 | 5/2012 | Phatak et al. |
| 8,187,945 B2 | 5/2012 | Herner |
| 8,198,144 B2 | 6/2012 | Herner |
| 8,207,064 B2 | 6/2012 | Bandyopadhyay et al. |
| 8,227,787 B2 | 7/2012 | Kumar et al. |
| 8,231,998 B2 | 7/2012 | Sastry et al. |
| 8,233,308 B2 | 7/2012 | Schricker et al. |
| 8,237,146 B2 | 8/2012 | Kreupl et al. |
| 8,243,542 B2 | 8/2012 | Bae et al. |
| 8,258,020 B2 | 9/2012 | Herner |
| 8,265,136 B2 | 9/2012 | Hong et al. |
| 8,274,130 B2 | 9/2012 | Mihnea et al. |
| 8,274,812 B2 | 9/2012 | Nazarian et al. |
| 8,305,793 B2 | 11/2012 | Majewski et al. |
| 8,315,079 B2 | 11/2012 | Kuo et al. |
| 8,320,160 B2 | 11/2012 | Nazarian |
| 8,351,241 B2 | 1/2013 | Lu et al. |
| 8,369,129 B2 | 2/2013 | Fujita et al. |
| 8,369,139 B2 | 2/2013 | Liu et al. |
| 8,374,018 B2 | 2/2013 | Lu |
| 8,385,100 B2 | 2/2013 | Kau et al. |
| 8,389,971 B2 | 3/2013 | Chen et al. |
| 8,394,670 B2 | 3/2013 | Herner |
| 8,399,307 B2 | 3/2013 | Herner |
| 8,441,835 B2 | 5/2013 | Jo et al. |
| 8,456,892 B2 | 6/2013 | Yasuda |
| 8,466,005 B2 | 6/2013 | Pramanik et al. |
| 8,467,226 B2 | 6/2013 | Bedeschi et al. |
| 8,467,227 B1 | 6/2013 | Jo |
| 8,502,185 B2 | 8/2013 | Lu et al. |
| 8,569,104 B2 | 10/2013 | Pham et al. |
| 8,587,989 B2 | 11/2013 | Manning et al. |
| 8,619,459 B1 | 12/2013 | Nguyen et al. |
| 8,658,476 B1 | 2/2014 | Sun et al. |
| 8,659,003 B2 | 2/2014 | Herner et al. |
| 8,675,384 B2 | 3/2014 | Kuo et al. |
| 8,693,241 B2 | 4/2014 | Kim et al. |
| 8,759,807 B2 * | 6/2014 | Sandhu ............... H01L 45/04 257/1 |
| 8,853,759 B2 | 10/2014 | Lee et al. |
| 8,854,859 B2 * | 10/2014 | Chung ............... G11C 11/1659 257/2 |
| 8,934,294 B2 | 1/2015 | Kim et al. |
| 8,937,292 B2 * | 1/2015 | Bateman ............ H01L 27/2454 257/5 |
| 8,946,667 B1 | 2/2015 | Clark et al. |
| 8,946,673 B1 | 2/2015 | Kumar |
| 8,947,908 B2 | 2/2015 | Jo |
| 8,999,811 B2 | 4/2015 | Endo et al. |
| 9,093,635 B2 | 7/2015 | Kim et al. |
| 9,166,163 B2 | 10/2015 | Gee et al. |
| 9,209,396 B2 | 12/2015 | Narayanan |
| 9,543,512 B2 * | 1/2017 | Ohba .................. H01L 45/142 |
| 9,590,013 B2 | 3/2017 | Jo et al. |
| 2002/0048940 A1 | 4/2002 | Derderian et al. |
| 2002/0101023 A1 | 8/2002 | Saltsov et al. |
| 2003/0006440 A1 | 1/2003 | Uchiyama |
| 2003/0036238 A1 | 2/2003 | Toet et al. |
| 2003/0052330 A1 | 3/2003 | Klein |
| 2003/0141565 A1 | 7/2003 | Hirose et al. |
| 2003/0174574 A1 | 9/2003 | Perner et al. |
| 2003/0176072 A1 | 9/2003 | Wang |
| 2003/0194865 A1 | 10/2003 | Gilton |
| 2003/0206659 A1 | 11/2003 | Hamanaka |
| 2003/0234449 A1 | 12/2003 | Aratani et al. |
| 2004/0026682 A1 | 2/2004 | Jiang |
| 2004/0036124 A1 | 2/2004 | Vyvoda et al. |
| 2004/0159835 A1 | 8/2004 | Krieger et al. |
| 2004/0170040 A1 | 9/2004 | Rinerson et al. |
| 2004/0192006 A1 | 9/2004 | Campbell et al. |
| 2004/0194340 A1 | 10/2004 | Kobayashi |
| 2004/0202041 A1 | 10/2004 | Hidenori |
| 2004/0240265 A1 | 12/2004 | Lu et al. |
| 2005/0019699 A1 | 1/2005 | Moore |
| 2005/0020510 A1 | 1/2005 | Benedict |
| 2005/0029587 A1 | 2/2005 | Harshfield |
| 2005/0041498 A1 | 2/2005 | Resta et al. |
| 2005/0052915 A1 | 3/2005 | Herner et al. |
| 2005/0062045 A1 | 3/2005 | Bhattacharyya |
| 2005/0073881 A1 | 4/2005 | Tran et al. |
| 2005/0101081 A1 | 5/2005 | Goda et al. |
| 2005/0162881 A1 | 7/2005 | Stasiak et al. |
| 2005/0175099 A1 | 8/2005 | Sarkijarvi et al. |
| 2006/0017488 A1 | 1/2006 | Hsu et al. |
| 2006/0028895 A1 | 2/2006 | Taussig et al. |
| 2006/0054950 A1 | 3/2006 | Baek et al. |
| 2006/0131556 A1 | 6/2006 | Liu et al. |
| 2006/0134837 A1 | 6/2006 | Subramanian et al. |
| 2006/0154417 A1 | 7/2006 | Shinmura et al. |
| 2006/0215445 A1 | 9/2006 | Baek et al. |
| 2006/0231910 A1 | 10/2006 | Hsieh et al. |
| 2006/0246606 A1 | 11/2006 | Hsu et al. |
| 2006/0268594 A1 | 11/2006 | Toda |
| 2006/0279979 A1 | 12/2006 | Lowrey et al. |
| 2006/0281244 A1 | 12/2006 | Ichige et al. |
| 2006/0286762 A1 | 12/2006 | Tseng et al. |
| 2007/0008773 A1 | 1/2007 | Scheuerlein |
| 2007/0015348 A1 | 1/2007 | Hsu et al. |
| 2007/0025144 A1 | 2/2007 | Hsu et al. |
| 2007/0035990 A1 | 2/2007 | Hush |
| 2007/0042612 A1 | 2/2007 | Nishino et al. |
| 2007/0045615 A1 | 3/2007 | Cho et al. |
| 2007/0069119 A1 | 3/2007 | Appleyard et al. |
| 2007/0087508 A1 | 4/2007 | Herner et al. |
| 2007/0090425 A1 | 4/2007 | Kumar et al. |
| 2007/0091685 A1 | 4/2007 | Guterman et al. |
| 2007/0105284 A1 | 5/2007 | Herner et al. |
| 2007/0105390 A1 | 5/2007 | Oh |
| 2007/0133250 A1 | 6/2007 | Kim |
| 2007/0133270 A1 | 6/2007 | Jeong et al. |
| 2007/0159869 A1 | 7/2007 | Baek et al. |
| 2007/0159876 A1 | 7/2007 | Sugibayashi et al. |
| 2007/0171698 A1 | 7/2007 | Hoenigschmid et al. |
| 2007/0205510 A1 | 9/2007 | Lavoie et al. |
| 2007/0228414 A1 | 10/2007 | Kumar et al. |
| 2007/0284575 A1 | 12/2007 | Li et al. |
| 2007/0285971 A1 | 12/2007 | Toda et al. |
| 2007/0290186 A1 | 12/2007 | Bourim et al. |
| 2007/0291527 A1 | 12/2007 | Tsushima et al. |
| 2007/0295950 A1 | 12/2007 | Cho et al. |
| 2007/0297501 A1 | 12/2007 | Hussain et al. |
| 2008/0002481 A1 | 1/2008 | Gogl et al. |
| 2008/0006907 A1 | 1/2008 | Lee et al. |
| 2008/0007987 A1 | 1/2008 | Takashima |
| 2008/0019163 A1 | 1/2008 | Hoenigschmid et al. |
| 2008/0043521 A1 | 2/2008 | Liaw et al. |
| 2008/0048164 A1 | 2/2008 | Odagawa |
| 2008/0083918 A1 | 4/2008 | Aratani et al. |
| 2008/0089110 A1 | 4/2008 | Robinett et al. |
| 2008/0090337 A1 | 4/2008 | Williams |
| 2008/0106925 A1 | 5/2008 | Paz De Araujo et al. |
| 2008/0106926 A1 | 5/2008 | Brubaker et al. |
| 2008/0165571 A1 | 7/2008 | Lung |
| 2008/0185567 A1 | 8/2008 | Kumar et al. |
| 2008/0192531 A1 | 8/2008 | Tamura et al. |
| 2008/0198934 A1 | 8/2008 | Hong et al. |
| 2008/0205179 A1 | 8/2008 | Markert et al. |
| 2008/0206931 A1 | 8/2008 | Breuil et al. |
| 2008/0220601 A1 | 9/2008 | Kumar et al. |
| 2008/0232160 A1 | 9/2008 | Gopalakrishnan |
| 2008/0278988 A1 | 11/2008 | Ufert |
| 2008/0278990 A1 | 11/2008 | Kumar et al. |
| 2008/0301497 A1 | 12/2008 | Chung et al. |
| 2008/0304312 A1 | 12/2008 | Ho et al. |
| 2008/0311722 A1 | 12/2008 | Petti et al. |

(56) References Cited

U.S. PATENT DOCUMENTS

| | | |
|---|---|---|
| 2009/0001341 A1 | 1/2009 | Breitwisch et al. |
| 2009/0001343 A1 | 1/2009 | Schricker et al. |
| 2009/0001345 A1 | 1/2009 | Schricker et al. |
| 2009/0003717 A1 | 1/2009 | Sekiguchi et al. |
| 2009/0014703 A1 | 1/2009 | Inaba |
| 2009/0014707 A1 | 1/2009 | Lu et al. |
| 2009/0052226 A1 | 2/2009 | Lee et al. |
| 2009/0091981 A1 | 4/2009 | Park et al. |
| 2009/0095951 A1 | 4/2009 | Kostylev et al. |
| 2009/0109728 A1 | 4/2009 | Maejima et al. |
| 2009/0122591 A1 | 5/2009 | Ryu |
| 2009/0134432 A1 | 5/2009 | Tabata et al. |
| 2009/0141567 A1 | 6/2009 | Lee et al. |
| 2009/0152737 A1 | 6/2009 | Harshfield |
| 2009/0168486 A1 | 7/2009 | Kumar |
| 2009/0173930 A1 | 7/2009 | Yasuda et al. |
| 2009/0227067 A1 | 9/2009 | Kumar et al. |
| 2009/0231905 A1 | 9/2009 | Sato |
| 2009/0231910 A1 | 9/2009 | Liu et al. |
| 2009/0250787 A1 | 10/2009 | Kutsunai |
| 2009/0251941 A1 | 10/2009 | Saito |
| 2009/0256130 A1 | 10/2009 | Schricker |
| 2009/0257265 A1 | 10/2009 | Chen et al. |
| 2009/0267047 A1 | 10/2009 | Sasago et al. |
| 2009/0267265 A1 | 10/2009 | Barlog |
| 2009/0268513 A1 | 10/2009 | De Ambroggi et al. |
| 2009/0272962 A1 | 11/2009 | Kumar et al. |
| 2009/0283736 A1 | 11/2009 | Kanzawa et al. |
| 2009/0283737 A1 | 11/2009 | Kiyotoshi |
| 2009/0298224 A1 | 12/2009 | Lowrey |
| 2009/0309087 A1* | 12/2009 | Lung .................. H01L 27/2409 257/2 |
| 2009/0321706 A1 | 12/2009 | Happ et al. |
| 2009/0321789 A1 | 12/2009 | Wang et al. |
| 2010/0007937 A1 | 1/2010 | Widjaja et al. |
| 2010/0012914 A1 | 1/2010 | Xu et al. |
| 2010/0019221 A1 | 1/2010 | Lung et al. |
| 2010/0019310 A1 | 1/2010 | Sakamoto |
| 2010/0032637 A1 | 2/2010 | Kinoshita et al. |
| 2010/0032638 A1 | 2/2010 | Xu |
| 2010/0032640 A1 | 2/2010 | Xu |
| 2010/0034518 A1 | 2/2010 | Iwamoto et al. |
| 2010/0038791 A1 | 2/2010 | Lee et al. |
| 2010/0039136 A1 | 2/2010 | Chua-Eoan et al. |
| 2010/0044708 A1 | 2/2010 | Lin et al. |
| 2010/0044798 A1 | 2/2010 | Hooker et al. |
| 2010/0046622 A1 | 2/2010 | Doser et al. |
| 2010/0067279 A1 | 3/2010 | Choi |
| 2010/0067282 A1 | 3/2010 | Liu et al. |
| 2010/0025675 A1 | 4/2010 | Yamazaki et al. |
| 2010/0084625 A1 | 4/2010 | Wicker et al. |
| 2010/0085798 A1 | 4/2010 | Lu et al. |
| 2010/0085822 A1 | 4/2010 | Yan et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0110767 A1 | 5/2010 | Katoh et al. |
| 2010/0118587 A1 | 5/2010 | Chen et al. |
| 2010/0140614 A1 | 6/2010 | Uchiyama et al. |
| 2010/0155784 A1 | 6/2010 | Scheuerlein |
| 2010/0157651 A1 | 6/2010 | Kumar et al. |
| 2010/0157656 A1 | 6/2010 | Tsuchida |
| 2010/0157659 A1 | 6/2010 | Norman |
| 2010/0157710 A1 | 6/2010 | Lambertson et al. |
| 2010/0163828 A1 | 7/2010 | Tu |
| 2010/0171086 A1 | 7/2010 | Lung et al. |
| 2010/0176367 A1 | 7/2010 | Liu |
| 2010/0176368 A1 | 7/2010 | Ko et al. |
| 2010/0182821 A1 | 7/2010 | Muraoka et al. |
| 2010/0203731 A1 | 8/2010 | Kong et al. |
| 2010/0219510 A1 | 9/2010 | Scheuerlein et al. |
| 2010/0221868 A1 | 9/2010 | Sandoval |
| 2010/0237314 A1 | 9/2010 | Tsukamoto et al. |
| 2010/0243983 A1 | 9/2010 | Chiang et al. |
| 2010/0258781 A1 | 10/2010 | Phatak et al. |
| 2010/0271885 A1 | 10/2010 | Scheuerlein et al. |
| 2010/0277969 A1 | 11/2010 | Li et al. |
| 2010/0321095 A1 | 12/2010 | Mikawa et al. |
| 2011/0006275 A1 | 1/2011 | Roelofs et al. |
| 2011/0007551 A1 | 1/2011 | Tian et al. |
| 2011/0033967 A1 | 2/2011 | Lutz et al. |
| 2011/0063888 A1 | 3/2011 | Chi et al. |
| 2011/0066878 A1 | 3/2011 | Hosono et al. |
| 2011/0068373 A1 | 3/2011 | Minemura et al. |
| 2011/0069533 A1 | 3/2011 | Kurosawa et al. |
| 2011/0089391 A1 | 4/2011 | Mihnea et al. |
| 2011/0122679 A1 | 5/2011 | Chen et al. |
| 2011/0128779 A1 | 6/2011 | Redaelli et al. |
| 2011/0133149 A1 | 6/2011 | Sonehara |
| 2011/0136327 A1 | 6/2011 | Han et al. |
| 2011/0151277 A1 | 6/2011 | Nishihara et al. |
| 2011/0155991 A1 | 6/2011 | Chen |
| 2011/0183525 A1 | 7/2011 | Purushothaman et al. |
| 2011/0193051 A1 | 8/2011 | Nam et al. |
| 2011/0194329 A1 | 8/2011 | Ohba et al. |
| 2011/0198557 A1 | 8/2011 | Rajendran et al. |
| 2011/0204312 A1 | 8/2011 | Phatak |
| 2011/0204314 A1 | 8/2011 | Baek et al. |
| 2011/0205780 A1 | 8/2011 | Yasuda et al. |
| 2011/0205782 A1 | 8/2011 | Costa et al. |
| 2011/0212616 A1 | 9/2011 | Seidel et al. |
| 2011/0215396 A1 | 9/2011 | Tang et al. |
| 2011/0227028 A1 | 9/2011 | Sekar et al. |
| 2011/0284814 A1 | 11/2011 | Zhang |
| 2011/0299324 A1 | 12/2011 | Li et al. |
| 2011/0305064 A1 | 12/2011 | Jo et al. |
| 2011/0305066 A1 | 12/2011 | Nazarian et al. |
| 2011/0310656 A1 | 12/2011 | Kreupl et al. |
| 2011/0312151 A1 | 12/2011 | Herner |
| 2011/0317470 A1 | 12/2011 | Lu et al. |
| 2012/0001145 A1 | 1/2012 | Magistretti et al. |
| 2012/0001146 A1 | 1/2012 | Lu et al. |
| 2012/0003800 A1 | 1/2012 | Lee et al. |
| 2012/0007035 A1 | 1/2012 | Jo et al. |
| 2012/0008366 A1 | 1/2012 | Lu |
| 2012/0012806 A1 | 1/2012 | Herner |
| 2012/0012808 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | Delucca et al. |
| 2012/0043519 A1 | 2/2012 | Jo et al. |
| 2012/0043520 A1 | 2/2012 | Herner et al. |
| 2012/0043621 A1 | 2/2012 | Herner |
| 2012/0043654 A1 | 2/2012 | Lu et al. |
| 2012/0044751 A1 | 2/2012 | Wang et al. |
| 2012/0044753 A1 | 2/2012 | Chung |
| 2012/0074374 A1 | 3/2012 | Jo |
| 2012/0074507 A1 | 3/2012 | Jo et al. |
| 2012/0076203 A1 | 3/2012 | Sugimoto et al. |
| 2012/0080798 A1 | 4/2012 | Harshfield |
| 2012/0087169 A1 | 4/2012 | Kuo et al. |
| 2012/0087172 A1 | 4/2012 | Aoki |
| 2012/0091420 A1 | 4/2012 | Kusai et al. |
| 2012/0104344 A1 | 5/2012 | Kakehashi |
| 2012/0104351 A1 | 5/2012 | Wei et al. |
| 2012/0108030 A1 | 5/2012 | Herner |
| 2012/0120712 A1 | 5/2012 | Kawai et al. |
| 2012/0122290 A1 | 5/2012 | Nagashima |
| 2012/0140816 A1 | 6/2012 | Franche et al. |
| 2012/0142163 A1 | 6/2012 | Herner |
| 2012/0145984 A1 | 6/2012 | Rabkin et al. |
| 2012/0147648 A1 | 6/2012 | Scheuerlein |
| 2012/0147657 A1 | 6/2012 | Sekar et al. |
| 2012/0155146 A1 | 6/2012 | Ueda et al. |
| 2012/0173795 A1 | 7/2012 | Schuette et al. |
| 2012/0176831 A1 | 7/2012 | Xiao et al. |
| 2012/0205606 A1 | 8/2012 | Lee et al. |
| 2012/0205793 A1 | 8/2012 | Schieffer et al. |
| 2012/0218807 A1 | 8/2012 | Johnson |
| 2012/0220100 A1 | 8/2012 | Herner |
| 2012/0224413 A1 | 9/2012 | Zhang et al. |
| 2012/0235112 A1 | 9/2012 | Huo et al. |
| 2012/0236625 A1 | 9/2012 | Ohba et al. |
| 2012/0241710 A1 | 9/2012 | Liu et al. |

(56) References Cited

U.S. PATENT DOCUMENTS

| | | |
|---|---|---|
| 2012/0243292 A1 | 9/2012 | Takashima et al. |
| 2012/0250183 A1 | 10/2012 | Tamaoka et al. |
| 2012/0250395 A1 | 10/2012 | Nodin |
| 2012/0252243 A1 | 10/2012 | Herner |
| 2012/0269275 A1 | 10/2012 | Hannuksela |
| 2012/0305874 A1 | 12/2012 | Herner |
| 2012/0305879 A1 | 12/2012 | Lu et al. |
| 2012/0315725 A1 | 12/2012 | Miller et al. |
| 2012/0320660 A1 | 12/2012 | Nazarian et al. |
| 2012/0326265 A1 | 12/2012 | Lai et al. |
| 2012/0327701 A1 | 12/2012 | Nazarian |
| 2013/0001494 A1 | 1/2013 | Chen et al. |
| 2013/0020548 A1 | 1/2013 | Clark et al. |
| 2013/0023085 A1 | 1/2013 | Pramanik et al. |
| 2013/0026440 A1 | 1/2013 | Yang et al. |
| 2013/0043455 A1 | 2/2013 | Bateman |
| 2013/0065066 A1 | 3/2013 | Sambasivan et al. |
| 2013/0075685 A1 | 3/2013 | Li et al. |
| 2013/0075688 A1 | 3/2013 | Xu et al. |
| 2013/0119341 A1 | 5/2013 | Liu et al. |
| 2013/0128653 A1 | 5/2013 | Kang et al. |
| 2013/0134379 A1 | 5/2013 | Lu |
| 2013/0166825 A1 | 6/2013 | Kim et al. |
| 2013/0207065 A1 | 8/2013 | Chiang |
| 2013/0214234 A1 | 8/2013 | Gopalan et al. |
| 2013/0235648 A1 | 9/2013 | Kim et al. |
| 2013/0248795 A1 | 9/2013 | Takahashi et al. |
| 2013/0248797 A1 | 9/2013 | Sandhu et al. |
| 2013/0264535 A1 | 10/2013 | Sonehara |
| 2013/0279240 A1 | 10/2013 | Jo |
| 2013/0308369 A1 | 11/2013 | Lu et al. |
| 2014/0015018 A1 | 1/2014 | Kim |
| 2014/0029327 A1 | 1/2014 | Strachan et al. |
| 2014/0070160 A1 | 3/2014 | Ishikawa et al. |
| 2014/0098619 A1 | 4/2014 | Nazarian |
| 2014/0103284 A1 | 4/2014 | Hsueh et al. |
| 2014/0145135 A1 | 5/2014 | Gee et al. |
| 2014/0166961 A1 | 6/2014 | Liao et al. |
| 2014/0175360 A1 | 6/2014 | Tendulkar et al. |
| 2014/0177315 A1 | 6/2014 | Pramanik et al. |
| 2014/0192589 A1 | 7/2014 | Maxwell et al. |
| 2014/0197369 A1 | 7/2014 | Sheng et al. |
| 2014/0233294 A1 | 8/2014 | Ting et al. |
| 2014/0264236 A1 | 9/2014 | Kim et al. |
| 2014/0264250 A1 | 9/2014 | Maxwell et al. |
| 2014/0268997 A1 | 9/2014 | Nazarian et al. |
| 2014/0268998 A1 | 9/2014 | Jo |
| 2014/0269002 A1 | 9/2014 | Jo |
| 2014/0312296 A1 | 10/2014 | Jo et al. |
| 2014/0335675 A1 | 11/2014 | Narayanan |
| 2015/0070961 A1 | 3/2015 | Katayama et al. |
| 2015/0228334 A1 | 8/2015 | Nazarian et al. |
| 2015/0228893 A1 | 8/2015 | Narayanan et al. |
| 2015/0243886 A1 | 8/2015 | Narayanan et al. |
| 2016/0111640 A1 | 4/2016 | Chang et al. |

FOREIGN PATENT DOCUMENTS

| | | |
|---|---|---|
| CN | 101170132 A | 4/2008 |
| CN | 101501850 A | 8/2009 |
| CN | 101568904 A | 10/2009 |
| CN | 101604729 A | 12/2009 |
| CN | 101636792 | 1/2010 |
| CN | 101636792 A | 1/2010 |
| CN | 102024494 | 4/2011 |
| CN | 102024494 A | 4/2011 |
| CN | 102077296 | 5/2011 |
| CN | 102077296 A | 5/2011 |
| CN | 102544049 A | 7/2012 |
| CN | 102804277 A | 11/2012 |
| CN | 102934229 A | 2/2013 |
| CN | 103262171 A | 8/2013 |
| EP | 0290731 A2 | 11/1988 |
| EP | 1096465 A2 | 5/2001 |
| EP | 2405441 A1 | 1/2012 |
| EP | 2408035 A2 | 1/2012 |
| JP | 2005506703 A | 3/2005 |
| JP | 2006032951 A | 2/2006 |
| JP | 2006253667 A1 | 9/2006 |
| JP | 2007067408 A | 3/2007 |
| JP | 2007281208 A | 10/2007 |
| JP | 2007328857 A | 12/2007 |
| JP | 2008503085 A | 1/2008 |
| JP | 2008147343 A | 6/2008 |
| JP | 2008177509 A | 7/2008 |
| JP | 2009021524 A | 1/2009 |
| JP | 2009043873 A | 2/2009 |
| JP | 2010062265 | 3/2010 |
| JP | 2011023645 A | 2/2011 |
| JP | 2011065737 A | 3/2011 |
| JP | 2012504840 A | 2/2012 |
| JP | 2012505551 A | 3/2012 |
| JP | 2012089567 A | 5/2012 |
| JP | 2012533195 A | 12/2012 |
| KR | 10-2005-0053516 A | 6/2005 |
| KR | 20090051206 A | 5/2009 |
| KR | 20110014248 A | 2/2011 |
| KR | 10-2012-0084270 | 7/2012 |
| KR | 10-1391435 | 4/2014 |
| TW | 382820 B | 2/2000 |
| TW | 434887 B | 5/2001 |
| TW | 476962 B | 2/2002 |
| TW | 200625635 A | 7/2006 |
| TW | 201304222 A | 1/2013 |
| WO | 3034498 A1 | 4/2003 |
| WO | 2005124787 A2 | 12/2005 |
| WO | 2009005699 A1 | 1/2009 |
| WO | 2009078251 A1 | 6/2009 |
| WO | 2009118194 A1 | 10/2009 |
| WO | 2009125777 A1 | 10/2009 |
| WO | 2010026654 A1 | 3/2010 |
| WO | 2010042354 A1 | 4/2010 |
| WO | 2010042732 A2 | 4/2010 |
| WO | 2011005266 A1 | 1/2011 |
| WO | 2011008654 A1 | 1/2011 |
| WO | 2011133138 A1 | 10/2011 |

OTHER PUBLICATIONS

International Search Report and Written Opinion for Application No. PCT/US2011/046035, dated Mar. 27, 2012, 6 pages.
International Search Report and Written Opinion for Application No. PCT/US2012/040232, dated Feb. 26, 2013, 7 pages.
International Search Report and Written Opinion for Application No. PCT/US2012/040242, dated Jan. 31, 2013, 9 pages.
International Search Report and Written Opinion for Application No. PCT/US2012/044077, dated Jan. 25, 2013, 9 pages.
International Search Report and Written Opinion for Application No. PCT/US2012/045312, dated Mar. 29, 2013, 11 pages.
International Search Report and Written Opinion for Application No. PCT/US2013/042746, dated Sep. 6, 2013, 7 pages.
International Search Report and Written Opinion for Application No. PCT/US2013/054976, dated Dec. 16, 2013, 9 pages.
International Search Report and Written Opinion for Application No. PCT/US2013/061244, dated Jan. 28, 2014, 8 pages.
International Search Report and Written Opinion for Application No. PCT/US2013/077628, dated Apr. 29, 2014, 12 pages.
International Search Report for Application No. PCT/US2009/060023, dated May 18, 2010, 3 pages.
International Search Report for Application No. PCT/US2009/061249, dated May 19, 2010, 3 pages.
International Search Report for Application No. PCT/US2011/040090, dated Feb. 17, 2012, 5 pages.
International Search Report for Application No. PCT/US2011/045124, dated May 29, 2012, 3 pages.
International Search Report for Application No. PCT/US2011/046036, dated Feb. 23, 2012, 3 pages.
Jafar M., et al., "Switching in Amorphous-silicon Devices," Physical Review, 1994, vol. 49 (19), pp. 611-615.
Japanese Office Action (English Translation) for Japanese Application No. 2011-153349 dated Feb. 24, 2015, 3 pages.

(56) References Cited

OTHER PUBLICATIONS

Japanese Office Action (English Translation) for Japanese Application No. 2013-525926 dated Mar. 3, 2015, 4 pages.
Japanese Office Action (English Translation) for Japanese Application No. 2014-513700 dated Jan. 12, 2016, 4 pages.
Japanese Search Report (English Translation) for Japanese Application No. 2013-525926 dated Feb. 9, 2015, 15 pages.
Japanese Search Report (English Translation) for Japanese Application No. 2011-153349 dated Feb. 9, 2015, 11 pages.
Japanese Search Report (English Translation) for Japanese Application No. 2014-513700 dated Jan. 14, 2016, 25 pages.
Jo S.H. et al., "High-Density Crossbar Arrays Based on a Si Memristive System", Supporting Information, 2009, pp. 1-4.
Jo S.H., et al., "A Silicon-Based Crossbar Ultra-High-Density Non-Volatile Memory", SSEL Annual Report, 2007.
Jo S.H., et al., "Ag/a-Si:H/c-Si Resistive Switching Nonvolatile Memory Devices," Nanotechnology Materials and Devices Conference, 2006, vol. 1, pp. 116-117.
Jo S.H., et al., "CMOS Compatible Nanoscale Nonvolatile Resistance Switching Memory," Nano Letters, 2008, vol. 8 (2), pp. 392-397.
Jo S.H., et al., "Experimental, Modeling and Simulation Studies of Nanoscale Resistance Switching Devices", 9.sup.th Conference on Nanotechnology, IEEE, 2009, pp. 493-495.
Jo S.H., et al., "High-Density Crossbar Arrays Based on a Si Memristive System," Nano Letters, 2009, vol. 9 (2), pp. 870-874.
Jo S.H., et al., "Nanoscale Memristive Devices for Memory and Logic Applications", Ph. D Dissertation, University of Michigan, 2010.
Jo S.H., et al., "Nanoscale Memristor Device as Synapse in Neuromorphic Systems," Nano Letters, 2010, vol. 10, pp. 1297-1301.
Jo S.H., et al., "Nonvolatile Resistive Switching Devices Based on Nanoscale Metal/Amorphous Silicon/Crystalline Silicon Junctions," Materials Research Society Symposium Proceedings, 2007, vol. 997.
Jo S.H., et al., "Programmable Resistance Switching in Nanoscale Two-Terminal Devices," Nano Letters, 2009, vol. 9 (1), pp. 496-500.
Jo S.H., et al., "Programmable Resistance Switching in Nanoscale Two-Terminal Devices," Supporting Information, Dec. 29, 2008, pp. 1-4, vol. 9., No. 1, Department of Electrical Engineering and Computer Science, the University of Michigan, Ann Arbor, Michigan.
Jo S.H., et al., "Si Memristive Devices Applied to Memory and Neuromorphic Circuits", Proceedings of 2010 IEEE International Symposium on Circuits and Systems, 2010, pp. 13-16.
Jo S.H., et al., "Si-Based Two-Terminal Resistive Switching Nonvolatile Memory", IEEE, 2008.
Kuk-Hwan Kim et al., "Nanoscale Resistive Memory with Intrinsic Diode Characteristics and Long Endurance," Applied Physics Letters, 2010, vol. 96, pp. 053106-1-053106-3.
Kund M., et al., "Conductive Bridging Ram (cbram): An Emerging Non-volatile Memory Technology Scalable to Sub 20nm", IEEE, 2005.
Le Comber P.G., et al., "The Switching Mechanism in Amorphous Silicon Junctions," Journal of Non-Crystalline Solids, 1985, vol. 77 & 78, pp. 1373-1382.
Le Comber P.G., "Present and Future Applications of Amorphous Silicon and Its Alloys," Journal of Non-Crystalline Solids, 1989, vol. 115, pp. 1-13.
Lee S.H., et al., "Full Integration and Cell Characteristics for 64Mb Nonvolatile PRAM", 2004 Symposium on VLSI Technology Digest of Technical Papers, IEEE, 2004, pp. 20-21.
Liu M., et al., "rFGA: CMOS-Nano Hybrid FPGA Using RRAM Components", IEEE CB3 N17 International Symposium on Nanoscale Architectures, Anaheim, USA, Jun. 12-13, 2008, pp. 93-98.
Lu W., et al., "Nanoelectronics from the Bottom Up," Nature Materials, 2007, vol. 6, pp. 841-850.
Lu W., et al., "Supporting Information", 2008.
Marand H., et al., MESc. 5025 lecture notes: Chapter 7. Diffusion, University of Vermont. Retrieved from the Internet on Sep. 9, 2016. https://www.yumpu.com/en/document/view/31750386/diffusion-1-color.
Moopenn A. et al., "Programmable Synaptic Devices for Electronic Neural Nets," Control and Computers, 1990, vol. 18 (2), pp. 37-41.
Muller D.A., et al., "The Electronic Structure at the Atomic Scale of Ultrathin Gate Oxides," Nature, 1999, vol. 399, pp. 758-761.
Muller G., et al., "Status and Outlook of Emerging Nonvolatile Memory Technologies", IEEE, 2004, pp. 567-570.
Newman R.C., "Defects in Silicon," Reports on Progress in Physics, 1982, vol. 45, pp. 1163-1210.
Notice of Allowance dated Nov. 26, 2013 for U.S. Appl. No. 13/481,696, 15 pages.
Notice of Allowance dated Dec. 16, 2014 for U.S. Appl. No. 12/835,704, 47 pages.
Office Action dated Aug. 12, 2016 for U.S. Appl. No. 14/667,346, 27 pages.
Office Action dated Aug. 12, 2016 for U.S. Appl. No. 14/613,301, 43 pages.
Office Action dated Aug. 23, 2016 for U.S. Appl. No. 14/613,585, 9 pages.
Notice of Allowance dated Sep. 14, 2016 for U.S. Appl. No. 14/588,202, 119 pages.
Notice of Allowance dated Oct. 5, 2016 for U.S. Appl. No. 14/887,050, 113 pages.
Notice of Allowance dated Oct. 7, 2016 for U.S. Appl. No. 14/213,953, 43 pages.
Japanese Office Action dated Aug. 9, 2016 for Japanese Application No. 2014-513700, 8 pages (including translation).
Notice of Allowance for U.S. Appl. No. 14/383,079 dated Aug. 17, 2016, 71 pages.
Chinese Office Action dated Sep. 1, 2016 for Chinese Application No. 201380027469.8, 8 pages (including translation).
Notice of Allowance for U.S. Appl. No. 13/952,467 dated Sep. 28, 2016, 128 pages.
Notice of Allowance for U.S. Appl. No. 15/046,172 dated Oct. 4, 2016, 116 pages.
Notice of Allowance for U.S. Appl. No. 14/612,025 dated Oct. 19, 2016, 108 pages.
Office Action for U.S. Appl. No. 14/597,151 dated Oct. 20, 2016, 52 pages.
Notice of Allowance for U.S. Appl. No. 14/509,967 dated Oct. 24, 2016, 42 pages.
Written Opinion for Application No. PCT/US2009/060023, dated May 18, 2010, 3 pages.
Written Opinion for Application No. PCT/US2009/061249, dated May 19, 2010, 3 pages.
Written Opinion for Application No. PCT/US2011/040090, dated Feb. 17, 2012, 6 pages.
Written Opinion for Application No. PCT/US2011/045124, dated May 29, 2012, 5 pages.
Written Opinion for Application No. PCT/US2011/046036, dated Feb. 23, 2012, 4 pages.
Yin S., "Solution Processed Silver Sulfide Thin Films for Filament Memory Applications", Technical Report No. UCB/EECS-2010-166, Dec. 17, 2010, Electrical Engineering and Computer Sciences, University of California at Berkeley. Retrieved from the Internet.
Yuan H.C., et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Zankovych S., et al., "Nanoimprint Lithography: Challenges and Prospects," Nanotechnology, 2001, vol. 12, pp. 91-95.
Office Action for U.S. Appl. No. 14/887,050 dated Mar. 11, 2016, 12 pages.
Office Action for U.S. Appl. No. 15/046,172 dated Apr. 20, 2016, 8 pages.
Office Action dated Apr. 1, 2013 for U.S. Appl. No. 13/174,077, filed Jun. 30, 2011.
Office Action dated Aug. 1, 2012 for U.S. Appl. No. 12/894,098, filed Sep. 29, 2010.

(56) References Cited

OTHER PUBLICATIONS

Office Action dated Mar. 1, 2012 for U.S. Appl. No. 12/835,704, filed Jul. 13, 2010.
Office Action dated Aug. 2, 2013 for U.S. Appl. No. 13/594,665, filed Aug. 24, 2012.
Office Action dated Sep. 2, 2014 for U.S. Appl. No. 13/705,082, 41 pages.
Office Action dated Apr. 3, 2014 for U.S. Appl. No. 13/870,919, filed Apr. 25, 2013.
Office Action dated Oct. 3, 2013 for U.S. Appl. No. 13/921,157, filed Jun. 18, 2013.
Office Action dated Apr. 5, 2012 for U.S. Appl. No. 12/833,898, filed Jul. 9, 2010.
Office Action dated Oct. 5, 2011 for U.S. Appl. No. 11/875,541, filed Oct. 19, 2007.
Office Action dated Apr. 6, 2015 for U.S. Appl. No. 14/034,390, filed Sep. 23, 2013.
Office Action dated Dec. 6, 2013 for U.S. Appl. No. 13/564,639, filed Aug. 1, 2012.
Office Action dated Dec. 6, 2013 for U.S. Appl. No. 13/960,735, filed Aug. 6, 2013.
Office Action dated Feb. 6, 2014 for U.S. Appl. No. 13/434,567, filed Mar. 29, 2012.
Office Action dated Mar. 6, 2013 for U.S. Appl. No. 13/174,264, filed Jun. 30, 2011.
Office Action dated Mar. 6, 2013 for U.S. Appl. No. 13/679,976, filed Nov. 16, 2012.
Office Action dated Sep. 6, 2011 for U.S. Appl. No. 12/582,086, filed Oct. 20, 2009.
Office Action dated Dec. 7, 2012 for U.S. Appl. No. 13/436,714, filed Mar. 30, 2012.
Office Action dated Mar. 7, 2013 for U.S. Appl. No. 13/651,169, filed Oct. 12, 2012.
Office Action dated May 7, 2013 for U.S. Appl. No. 13/585,759, filed Aug. 14, 2012.
Office Action dated Jan. 8, 2014 for U.S. Appl. No. 12/861,432, filed Aug. 23, 2010.
Office Action dated Jun. 8, 2012 for U.S. Appl. No. 11/875,541, filed Oct. 19, 2007.
Office Action dated Aug. 9, 2013 for U.S. Appl. No. 13/764,710, filed Feb. 11, 2013.
Office Action dated Jul. 9, 2013 for U.S. Appl. No. 13/447,036, filed Apr. 13, 2012.
Office Action dated Jul. 9, 2014 for U.S. Appl. No. 14/166,691, filed Jan. 28, 2014.
Office Action dated Oct. 9, 2012 for U.S. Appl. No. 13/417,135, filed Mar. 9, 2012.
Office Action dated Jan. 10, 2014 for U.S. Appl. No. 13/920,021, filed Jun. 17, 2013.
Office Action dated Apr. 11, 2014 for U.S. Appl. No. 13/143,047, filed Jun. 30, 2011.
Office Action dated Feb. 11, 2014 for U.S. Appl. No. 13/620,012, filed Sep. 14, 2012.
Office Action dated Jul. 11, 2013 for U.S. Appl. No. 13/764,698, filed Feb. 11, 2013.
Office Action dated Sep. 11, 2014 for U.S. Appl. No. 13/739,283, filed Jan. 11, 2013.
Office Action dated Aug. 12, 2013 for U.S. Appl. No. 13/077,941, filed Mar. 31, 2011.
Office Action dated Mar. 12, 2014 for U.S. Appl. No. 13/167,920, filed Jun. 24, 2011.
Office Action dated Sep. 12, 2014 for U.S. Appl. No. 13/426,869, filed Mar. 22, 2012.
Office Action dated Sep. 12, 2014 for U.S. Appl. No. 13/756,498.
Office Action dated Dec. 3, 2015 for U.S. Appl. No. 14/253,796.
Office Action dated Feb. 13, 2014 for U.S. Appl. No. 13/174,077, filed Jun. 30, 2011.
Office Action dated Mar. 14, 2012 for U.S. Appl. No. 12/815,369, filed Jun. 14, 2010.
Office Action dated Mar. 14, 2014 for U.S. Appl. No. 12/835,704, filed Jul. 13, 2010.
Office Action dated Apr. 15, 2016 for U.S. Appl. No. 14/597,151.
Office Action dated Apr. 16, 2012 for U.S. Appl. No. 12/834,610, filed Jul. 12, 2010.
Office Action dated Jan. 16, 2014 for U.S. Appl. No. 13/739,283, filed Jan. 11, 2013.
Office Action dated May 16, 2012 for U.S. Appl. No. 12/815,318, filed Jun. 14, 2010.
Office Action dated Oct. 16, 2012 for U.S. Appl. No. 12/861,650, filed Aug. 23, 2010.
Office Action dated Apr. 17, 2012 for U.S. Appl. No. 12/814,410, filed Jun. 11, 2010.
Office Action dated Feb. 17, 2011 for U.S. Appl. No. 12/913,719, filed Oct. 27, 2010.
Office Action dated Jun. 17, 2014 for U.S. Appl. No. 14/072,657, filed Nov. 5, 2013.
Office Action dated Mar. 17, 2015 for U.S. Appl. No. 14/573,770.
Office Action dated Apr. 19, 2011 for U.S. Appl. No. 12/582,086, filed Oct. 20, 2009.
Office Action dated Aug. 19, 2013 for U.S. Appl. No. 13/585,759, filed Aug. 14, 2012.
Office Action dated Jun. 19, 2012 for U.S. Appl. No. 13/149,757, filed May 31, 2011.
Office Action dated Mar. 19, 2013 for U.S. Appl. No. 13/465,188, filed May 7, 2012.
Office Action dated Mar. 19, 2013 for U.S. Appl. No. 13/564,639, filed Aug. 1, 2012.
Office Action dated May 20, 2013 for U.S. Appl. No. 13/725,331, filed Dec. 21, 2012.
Office Action dated Nov. 20, 2012 for U.S. Appl. No. 13/149,653, filed May 31, 2011.
Office Action dated Sep. 20, 2013 for U.S. Appl. No. 13/481,600, filed May 25, 2012.
Office Action dated Mar. 21, 2014 for U.S. Appl. No. 13/447,036, filed Apr. 13, 2012.
Office Action dated May 21, 2014 for U.S. Appl. No. 13/764,698, filed Feb. 11, 2013.
Office Action dated Sep. 21, 2011 for U.S. Appl. No. 12/835,704, filed Jul. 13, 2010.
Office Action dated Jul. 22, 2010 for U.S. Appl. No. 11/875,541, filed Oct. 19, 2007.
Office Action dated Jul. 22, 2011 for U.S. Appl. No. 12/913,719, filed Oct. 27, 2010.
Office Action dated Sep. 22, 2013 for U.S. Appl. No. 13/189,401, filed Jul. 22, 2011.
Office Action dated May 23, 2013 for U.S. Appl. No. 13/592,224, filed Aug. 22, 2012.
Office Action dated Aug. 24, 2011 for U.S. Appl. No. 12/835,699, filed Jul. 13, 2010.
Office Action dated Apr. 25, 2012 for U.S. Appl. No. 13/149,653, filed May 31, 2011.
Office Action dated Apr. 25, 2014 for U.S. Appl. No. 13/761,132, filed Feb. 6, 2013.
Office Action dated Jan. 25, 2012 for U.S. Appl. No. 12/861,650, filed Aug. 23, 2010.
Office Action dated Oct. 25, 2012 for U.S. Appl. No. 13/461,725, filed May 1, 2012.
Office Action dated Sep. 25, 2013 for U.S. Appl. No. 13/194,479, filed Jul. 29, 2011.
Office Action dated Nov. 26, 2012 for U.S. Appl. No. 13/156,232.
Office Action dated Aug. 27, 2013 for U.S. Appl. No. 13/436,714, filed Mar. 30, 2012.
Office Action dated Dec. 27, 2013 for U.S. Appl. No. 13/525,096, filed Jun. 15, 2012.
Office Action dated Mar. 27, 2012 for U.S. Appl. No. 13/314,513, filed Dec. 8, 2011.
Office Action dated Jan. 29, 2014 for U.S. Appl. No. 13/586,815, filed Aug. 15, 2012.
Office Action dated Jul. 29, 2013 for U.S. Appl. No. 13/466,008, filed May 7, 2012.
Office Action dated Mar. 29, 2013 for U.S. Appl. No. 12/861,432, filed Aug. 23, 2010.

(56) References Cited

OTHER PUBLICATIONS

Office Action dated Jul. 30, 2012 for U.S. Appl. No. 12/900,232, filed Oct. 7, 2010.
Office Action dated Jun. 30, 2014 for U.S. Appl. No. 13/531,449, filed Jun. 22, 2012.
Office Action dated Mar. 30, 2011 for U.S. Appl. No. 11/875,541, filed Oct. 19, 2007.
Office Action dated Sep. 30, 2013 for U.S. Appl. No. 13/189,401, filed Jul. 22, 2011.
Office Action dated Sep. 30, 2013 for U.S. Appl. No. 13/462,653, filed May 2, 2012.
Office Action dated Apr. 8, 2016 for U.S. Appl. No. 14/573,770.
Office Action dated May 20, 2016 for U.S. Appl. No. 14/613,299.
Office Action dated Jul. 9, 2015 for U.S. Appl. No. 14/573,817.
Owen A.E., et al., "Electronic Switching in Amorphous Silicon Devices: Properties of the Conducting Filament", Proceedings of 5th International Conference on Solid-State and Integrated Circuit Technology, IEEE, 1998, pp. 830-833.
Owen A.E., et al., "Memory Switching in Amorphous Silicon Devices," Journal of Non-Crystalline Solids, 1983, vol. 50-60 (Pt.2), pp. 1273-1280.
Owen A.E., et al., "New Amorphous-Silicon Electrically Programmable Nonvolatile Switching Device," Solid-State and Electron Devices, IEEE Proceedings, 1982, vol. 129 (Pt. 1), pp. 51-54.
Owen A.E., et al., "Switching in Amorphous Devices," International Journal of Electronics, 1992, vol. 73 (5), pp. 897-906.
Rose M.J., et al., "Amorphous Silicon Analogue Memory Devices," Journal of Non-Crystalline Solids, 1989, vol. 115, pp. 168-170.
Russo U., et al., "Self-Accelerated Thermal Dissolution Model for Reset Programming in Unipolar Resistive-Switching Memory (RRAM) Devices," IEEE Transactions on Electron Devices, 2009, vol. 56 (2), pp. 193-200.
Scott J.C., "Is There an Immortal Memory?," American Association for the Advancement of Science, 2004, vol. 304 (5667), pp. 62-63.
Shin W., et al., "Effect of Native Oxide on Polycrystalline Silicon CMP," Journal of the Korean Physical Society, 2009, vol. 54 (3), pp. 1077-1081.
Stikeman A., Polymer Memory—The Plastic Path to Better Data Storage, Technology Review, Sep. 2002, pp. 31. Retrieved from the Internet.
Suehle J.S., et al., "Temperature Dependence of Soft Breakdown and Wear-out in Sub-3 Nm Si02 Films", 38th Annual International Reliability Physics Symposium, San Jose, California, 2000, pp. 33-39.
Sune J., et al., "Nondestructive Multiple Breakdown Events in Very Thin Si02 Films," Applied Physics Letters, 1989, vol. 55, pp. 128-130.
Terabe K., et al., "Quantized Conductance Atomic Switch," Nature, 2005, vol. 433, pp. 47-50.
Waser R., et al., "Nanoionics-based Resistive Switching Memories," Nature Materials, 2007, vol. 6, pp. 833-835.
Office Action for U.S. Appl. No. 14/588,136 dated Nov. 2, 2016, 132 pages.
Notice of Allowance dated Dec. 19, 2014 for U.S. Appl. No. 13/529,985, 9 pgs.
Notice of Allowance dated Jul. 1, 2016 for U.S. Appl. No. 14/213,953, 96 pages.
Notice of Allowance dated Jul. 17, 2014 for U.S. Appl. No. 12/861,432, 25 pages.
Notice of Allowance dated Aug. 28, 2015 for U.S. Appl. No. 14/573,770, 23 pages.
Notice of Allowance for U.S Appl. No. 14/509,967 dated Feb. 17, 2016, 18 pages.
Notice of Allowance for U.S Appl. No. 14/509,967 dated Jun. 6, 2016, 96 pages.
Notice of Allowance for U.S. Appl. No. 14/213,953 dated Feb. 16, 2016, 21 pages.
Notice of Allowance for U.S. Appl. No. 14/611,022 dated Feb. 12, 2016, 13 pages.
Notice of Allowance for U.S. Appl. No. 14/611,022 dated Jun. 8, 2016, 57 pages.
Notice of Allowance for U.S. Appl. No. 14/611,022 dated Sep. 10, 2015, 13 pages.
Notice of Allowance for U.S. Appl. No. 14/612,025 dated Jul. 22, 2015, 25 pages.
Notice of Allowance for U.S. Appl. No. 13/912,136 dated Aug. 3, 2015, 15 pages.
Notice of Allowance for U.S. Appl. No. 13/952,467 dated May 20, 2016, 19 pages.
Notice of Allowance for U.S. Appl. No. 14/027,045 dated Jun. 9, 2015, 14 pages.
Notice of Allowance for U.S. Appl. No. 14/383,079 dated Jan. 4, 2016, 27 pages.
Notice of Allowance for U.S. Appl. No. 14/588,202 dated Jan. 20, 2016, 15 pages.
Notice of Allowance for U.S. Appl. No. 14/887,050 dated Jun. 22, 2016, 13 pages.
Notice of Allowance for U.S. Appl. No. 14/946,367 dated Jul. 13, 2016, 23 pages.
Notice of Allowance dated Sep. 4, 2014 for U.S. Appl. No. 13/761,132, filed Feb. 6, 2013.
Notice of Allowance dated Oct. 5, 2011 for U.S. Appl. No. 12/940,920, filed Nov. 5, 2010.
Notice of Allowance dated Feb. 6, 2012 for U.S. Appl. No. 12/835,699, filed Jul. 13, 2010.
Notice of Allowance dated Feb. 6, 2013 for U.S. Appl. No. 13/118,258, filed May 27, 2011.
Notice of Allowance dated Aug. 8, 2013 for U.S. Appl. No. 13/733,828, filed Jan. 3, 2013.
Notice of Allowance dated Jan. 8, 2013 for U.S. Appl. No. 12/814,410, filed Jun. 11, 2010.
Notice of Allowance dated Oct. 8, 2013 for U.S. Appl. No. 13/769,152, filed Feb. 15, 2013.
Notice of Allowance dated Oct. 8, 2013 for U.S. Appl. No. 13/905,074, filed May 29, 2013.
Notice of Allowance dated Apr. 9, 2013 for U.S. Appl. No. 13/748,490, filed Jan. 23, 2013.
Notice of Allowance dated Sep. 9, 2014 for U.S. Appl. No. 13/620,012, filed Sep. 14, 2012.
Notice of Allowance dated Sep. 9, 2014 for U.S. Appl. No. 13/870,919, filed Apr. 25, 2013.
Notice of Allowance dated Jan. 11, 2016 for U.S. Appl. No. 14/613,299.
Notice of Allowance dated Jan. 20, 2016 for U.S. Appl. No. 14/034,390.
Notice of Allowance dated Oct. 10, 2013 for U.S. Appl. No. 13/452,657, filed Apr. 20, 2012.
Notice of Allowance dated Jan. 11, 2013 for U.S. Appl. No. 12/894,087, filed Sep. 29, 2010.
Notice of Allowance dated May 11, 2012 for U.S. Appl. No. 12/939,824, filed Nov. 4, 2010.
Notice of Allowance dated Mar. 12, 2012 for U.S. Appl. No. 12/913,719, filed Oct. 27, 2010.
Notice of Allowance dated Nov. 13, 2013 for U.S. Appl. No. 13/461,725, filed May 1, 2012.
Notice of Allowance dated Nov. 14, 2012 for U.S. Appl. No. 12/861,666, filed Aug. 23, 2010.
Notice of Allowance dated Nov. 14, 2012 for U.S. Appl. No. 13/532,019, filed Jun. 25, 2012.
Notice of Allowance dated Mar. 15, 2013 for U.S. Appl. No. 12/894,098, filed Sep. 29, 2010.
Notice of Allowance dated Jan. 16, 2014 for U.S. Appl. No. 13/921,157, filed Jun. 18, 2013.
Notice of Allowance dated Oct. 16, 2013 for U.S. Appl. No. 13/174,264, filed Jun. 30, 2011.
Notice of Allowance dated Apr. 17, 2012 for U.S. Appl. No. 13/158,231, filed Jun. 10, 2011.
Notice of Allowance dated Jan. 17, 2014 for U.S. Appl. No. 13/725,331, filed Dec. 21, 2012.
Notice of Allowance dated Mar. 17, 2014 for U.S. Appl. No. 13/592,224, filed Aug. 22, 2012.

(56) References Cited

OTHER PUBLICATIONS

Notice of Allowance dated May 17, 2013 for U.S. Appl. No. 13/290,024.
Notice of Allowance dated Sep. 17, 2013 for U.S. Appl. No. 13/679,976, filed Nov. 16, 2012.
Notice of Allowance dated Sep. 17, 2014 for U.S. Appl. No. 13/960,735, filed Aug. 6, 2013.
Notice of Allowance dated Sep. 17, 2014 for U.S. Appl. No. 13/462,653, filed May 2, 2012.
Notice of Allowance dated Sep. 18, 2012 for U.S. Appl. No. 12/900,232, filed Oct. 7, 2010.
Notice of Allowance dated Sep. 18, 2014 for U.S. Appl. No. 13/920,021, filed Jun. 17, 2013.
Advisory Action dated Jun. 8, 2012 for U.S. Appl. No. 12/835,704, filed Jul. 13, 2010.
Avila A., et al., "Switching in Coplanar Amorphous Hydrogenated Silicon Devices," Solid-State Electronics, 2000, vol. 14 (1), pp. 17-27.
Cagli C., et al., "Evidence for Threshold Switching in the Set Process of Nio-based Rram and Physical Modeling for Set, Reset, Retention and Disturb Prediction", 2008 IEEE International Electron Devices Meeting (IEDM), Dec. 15-17, 2008, pp. 1-4, San Francisco, CA, USA.
Chang P.H., at al., "Aluminum Spiking at Contact Windows in Al/Ti—W/Si," Applied Physics Letters, 1988, vol. 52 (4), pp. 272-274.
Chen Y., et al., "Nanoscale Molecular-switch Crossbar Circuits," Nanotechnology, 2003, vol. 14, pp. 462-468.
Chinese Office Action (English Translation) for Chinese Application No. 201180050941.0 dated Apr. 3, 2015, 8 pages.
Chinese Office Action (English Translation) for Chinese Application No. 201280027066.9 dated Nov. 23, 2015, 6 pages.
Chinese Office Action (English Translation) for Chinese Application No. 201110195933.7 dated Jul. 31, 2014, 4 pages.
Chinese Office Action (English Translation) for Chinese Application No. 201110195933.7 dated May 18, 2015, 4 pages.
Chinese Office Action (English Translation) for Chinese Application No. 201180050941.0 dated Dec. 9, 2015, 5 pages.
Chinese Office Action (with English Translation) for Chinese Application No. 201280027066.9 dated Jul. 4, 2016, 5 pages.
Chinese Office Action (with English Translation) for Chinese Application No. 201290000773.4 dated Jun. 9, 2014, 3 pages.
Chinese Seach Report (English Translation) for Chinese Application No. 201180050941.0 dated Mar. 25, 2015, 1 page.
Chinese Search Report (English Translation) for Chinese Application No. 201280027066.9 dated Nov. 13, 2015, 2 pages.
Choi J.W., "Bistable [2]Rotaxane Based Molecular Electronics: Fundamentals and Applications", Dissertation, Chapter 3, California Institute of Technology, Pasadena, 2007, pp. 79-120. Retrieved from the Internet.
Chou S.Y., et al., "Imprint Lithography With 25-Nanometer Resolution," Science, 1996, vol. 272, pp. 85-87.
Collier C.P., et al., "Electronically Configurable Molecular-based Logic Gates ," Science, 1999, vol. 285 (5426), pp. 391-395.
Corrected Notice of Allowability dated Nov. 20, 2014 for U.S. Appl. No. 13/594,665, 5 pages.
Corrected Notice of Allowability dated Jun. 15, 2016 for U.S. Appl. No. 13/952,467, 10 pages.
Corrected Notice of Allowability dated Oct. 1, 2013 for U.S. Appl. No. 13/733,828, filed Jan. 3, 2013.
Corrected Notice of Allowance dated Jan. 11, 2013 for U.S. Appl. No. 12/861,666 dated Aug. 23, 2010.
Dehon A., "Array-Based Architecture for FET-Based, Nanoscale Electronics," IEEE Transactions on Nanotechnology, 2003, vol. 2 (1), pp. 23-32.
Del Alamo J., et al., "Operating limits of Al-alloyed High-low Junction for BSF Solar Cells," Solid-State Electronics, 1981, vol. 24, pp. 415-420.
Den Boer W., "Threshold Switching in Hydrogenated Amorphous Silicon," Applied Physics Letters, 1982, vol. 40, pp. 812-813.

Dey S.K., "Electrothermal Model of Switching in Amorphous Silicon Films," Journal of Vacuum Science & Technology , 1980, vol. 17 (1), pp. 445-448.
Dong Y., et al., "Si/a—Si Core/Shell Nanowires as Nonvolatile Crossbar Switches," Nano Letters, 2008, vol. 8 (2), pp. 386-391.
European Office Action for Application No. 11005649.6 dated Dec. 1, 2014, 2 pages.
European Office Action for Application No. 11005649.6 dated Nov. 17, 2015, 5 pages.
European Office Action for Application No. EP11005207.3 dated Aug. 8, 2012, 4 pages.
European Search Report for Application No. EP09819890.6 dated Mar. 27, 2012.
European Search Report for Application No. EP11005207.3 dated Oct. 12, 2011.
European Search Report for Application No. EP14000949, dated Jun. 4, 2014, 7 pages.
European Search Report for European Application No. EP11005649 dated Oct. 15, 2014, 2 pages.
Ex parte Quayle Action mailed May 8, 2012 for U.S. Appl. No. 12/826,653, filed Jun. 29, 2010.
Final Office Action dated Jun. 29, 2016 for U.S. Appl. No. 14/692,677, 21 pages.
Final Office Action for U.S. Appl. No. 14/612,025 dated Jun. 14, 2016, 7 pages.
Final Office Action dated Feb. 1, 2016 for U.S. Appl. No. 14/573,817.
Final Office Action dated May 20, 2016 for U.S. Appl. No. 14/253,796.
Final Office Action dated Aug. 13, 2014 for U.S. Appl. No. 13/525,096, filed Jun. 15, 2012.
Gangopadhyay S., et al., "Memory Switching in Sputtered Hydrogenated Amorphous Silicon (a-Si:H)," Japanese Journal of Applied Physics, 1985, vol. 24 (10), pp. 1363-1364.
Goronkin H., et al., High-Performance Emerging Solid-State Memory Technologies, MRS Bulletin, Nov. 2004, pp. 805-813. Retrieved from the Internet.
Hajto J., et al., "Electronic Switching in Amorphous-Semiconductor Thin Films," Amorphous & Microcrystalline Semiconductor Devices: Materials and Device Physics, Chapter 14, 1992, pp. 640-701, vol. 2, Artech House, Inc.
Hajto J., et al., "Analogue Memory and Ballistic Electron Effects in Metal-amorphous Silicon Structures," Philosophical Magazine, 1991, vol. 63 (1), pp. 349-369.
Hajto J., et al., "The Programmability of Amorphous Silicon Analogue Memory Elements," Materials Research Society Symposium Proceedings , 1990, vol. 192, pp. 405-410.
Holmes A.J., et al., "Design of Analogue Synapse Circuits using Non-Volatile a-Si:H Memory Devices", Proceedings of ISCAS, 1994, pp. 351-354.
Hu J., et al., "AC Characteristics of Cr/p.sup.+a-Si:H/V Analog Switching Devices," IEEE Transactions on Electron Devices, 2000, vol. 47 (9), pp. 1751-1757.
Hu X.Y., et al., "Write Amplification Analysis in Flash-based Solid State Drives", SYSTOR'09; 20090504-20090406, May 4, 2009, pp. 1-9.
Hu., et al., "Area-Dependent Switching in Thin Film-Silicon Devices," Materials Research Society Symposium Proceedings, 2003, vol. 762, pp. A 18.3.1-A 18.3.6.
Hu., et al., "Switching and Filament Formation in hot-wire CVD p-type a-Si:H devices," Thin Solid Films, Science Direct, 2003, vol. 430, pp. 249-252.
Hudgens S., et al., "Overview of Phase-Change Chalcogenide Nonvolatile Memory Technology", MRS Bulletin, Nov. 2004, pp. 829-832. Retrieved from the Internet.
Notice of Allowance for U.S. Appl. No. 14/611,022 dated Oct. 26, 2016, 41 pages.
Notice of Allowance dated Sep. 18, 2014 for U.S. Appl. No. 13/586,815, filed Aug. 15, 2012.
Notice of Allowance dated Jun. 19, 2012 for U.S. Appl. No. 12/861,650, filed Aug. 23, 2010.
Notice of Allowance dated Sep. 19, 2013 for U.S. Appl. No. 13/585,759, filed Aug. 14, 2012.
Notice of Allowance dated Apr. 2, 2013 for U.S. Appl. No. 13/149,757, filed May 31, 2011.

(56) References Cited

OTHER PUBLICATIONS

Notice of Allowance dated Feb. 10, 2015 for U.S. Appl. No. 13/525,096, filed Jun. 15, 2012.
Notice of Allowance dated Feb. 20, 2014 for U.S. Appl. No. 13/468,201, filed May 10, 2012.
Notice of Allowance dated Mar. 20, 2014 for U.S. Appl. No. 13/598,550, filed Aug. 29, 2012.
Notice of Allowance dated Mar. 20, 2014 for U.S. Appl. No. 13/461,725, filed May 1, 2012.
Notice of Allowance dated Oct. 21, 2011 for U.S. Appl. No. 12/582,086, filed Oct. 20, 2009.
Notice of Allowance dated Oct. 21, 2014 for U.S. Appl. No. 13/426,869, filed Mar. 22, 2012.
Notice of Allowance dated May 22, 2012 for U.S. Appl. No. 12/815,369, filed Jun. 14, 2010.
Notice of Allowance dated Dec. 23, 2015 for U.S. Appl. No. 14/573,770.
Notice of Allowance dated Oct. 23, 2013 for U.S. Appl. No. 13/417,135, filed Mar. 9, 2012.
Notice of Allowance dated Jan. 24, 2013 for U.S. Appl. No. 13/314,513, filed Dec. 8, 2011.
Notice of Allowance dated Jul. 24, 2012 for U.S. Appl. No. 12/939,824, filed Nov. 4, 2010.
Notice of Allowance dated Oct. 25, 2012 for U.S. Appl. No. 12/894,087, filed Sep. 29, 2010.
Notice of Allowance dated Sep. 25, 2014 for U.S. Appl. No. 13/447,036, filed Apr. 13, 2012.
Notice of Allowance dated Sep. 26, 2014 for U.S. Appl. No. 13/594,665, filed Aug. 24, 2012.
Notice of Allowance dated Aug. 27, 2014 for U.S. Appl. No. 13/077,941, filed Mar. 31, 2011.
Notice of Allowance dated Nov. 28, 2012 for U.S. Appl. No. 13/290,024, filed Nov. 4, 2011.
Notice of Allowance dated Oct. 28, 2013 for U.S. Appl. No. 13/194,500, filed Jul. 29, 2011.
Notice of Allowance dated Oct. 28, 2013 for U.S. Appl. No. 13/651,169, filed Oct. 12, 2012.
Notice of Allowance dated Nov. 29, 2012 for U.S. Appl. No. 12/815,318, filed Jun. 14, 2010.
Notice of Allowance dated Oct. 29, 2012 for U.S. Appl. No. 13/149,807, filed May 31, 2011.
Notice of Allowance dated May 30, 2012 for U.S. Appl. No. 12/833,898, filed Jul. 9, 2010.
Notice of Allowance dated Sep. 30, 2013 for U.S. Appl. No. 13/481,696, filed May 25, 2012.
Notice of Allowance dated Aug. 31, 2012 for U.S. Appl. No. 13/051,296, filed Mar. 18, 2011.
Notice of Allowance dated Apr. 20, 2016 for U.S. Appl. No. 14/573,817.
Notice of Allowance dated Oct. 8, 2014 for U.S. Appl. No. 13/077,941, filed Mar. 31, 2011.
Notice of Allowance dated Aug. 26, 2015 for U.S. Appl. No. 14/034,390.
Notice of Allowance dated Sep. 8, 2015 for U.S. Appl. No. 14/613,299.
Office Action dated Dec. 31, 2015 for U.S. Appl. No. 14/692,677, 27 pages.
Office Action dated Feb. 5, 2015 for U.S. Appl. No. 14/027,045, 6 pages.
Office Action dated Apr. 11, 2014 for U.S. Appl. No. 13/594,665, 44 pages.
Office Action dated Apr. 6, 2015 for U.S. Appl. No. 13/912,136, 23 pages.
Office Action for U.S. Appl. No. 14/611,022 dated May 7, 2015, 13 pages.
Office Action for U.S. Appl. No. 14/612,025 dated Feb. 1, 2016, 12 pages.
Office Action for U.S. Appl. No. 13/952,467 dated Jan. 15, 2016, 22 pages.
Office Action for U.S. Appl. No. 14/194,499 dated May 18, 2016, 10 pages.
Office Action for U.S. Appl. No. 14/207,430 dated Oct. 15, 2015, 57 pages.
Office Action for U.S. Appl. No. 14/207,430 dated Mar. 10, 2016, 78 pages.
Office Action for U.S. Appl. No. 14/207,430 dated Jul. 25, 2016, 79 pages.
Office Action for U.S. Appl. No. 14/213,953 dated Nov. 9, 2015, 20 pages.
Office Action for U.S. Appl. No. 14/383,079 dated May 10, 2016, 7 pages.
Office Action for U.S. Appl. No. 14/383,079 dated Aug. 4, 2015, 11 pages.
Office Action for U.S. Appl. No. 14/588,202 dated May 10, 2016, 8 pages.
Office Action for U.S. Appl. No. 14/588,202 dated Sep. 11, 2015, 9 pages.
Office Action for U.S. Appl. No. 14/613,301 dated Feb. 4, 2016, 42 pages.
Office Action for U.S. Appl. No. 14/613,301 dated Mar. 31, 2015, 58 pages.
Office Action for U.S. Appl. No. 14/613,301 dated Jul. 31, 2015, 26 pages.
Notice of Allowance for U.S. Appl. No. 14/692,677 dated Nov. 21, 2016, 97 pages.
Corrected Notice of Allowability dated Dec. 6, 2016 for U.S. Appl. No. 14/383,079, 33 pages.
Notice of Allowance for U.S. Appl. No. 14/194,499 dated Dec. 12, 2016, 125 pages.
Chinese Office Action dated Feb. 17, 2017 for Chinese Application No. 201280027066.9, 9 pages (with English translation).
Taiwanese Office Action dated Dec. 6, 2016 for Taiwanese Application No. 102129266, 7 pages (with English translation).
Office Action for U.S. Appl. No. 14/667,346 dated Feb. 9, 2017, 29 pages.
Taiwanese Office Action dated Apr. 20, 2017 for Taiwanese Application No. 103109555, 12 pages (with English translation).
Office Action for U.S. Appl. No. 14/587,711 dated Apr. 21, 2017, 134 pages.
Korean Office Action dated Apr. 17, 2017 for Korean Application No. 10-2011-0069311, 20 pages (with English translation).
Office Action for U.S. Appl. No. 14/667,346 dated Jun. 2, 2017, 115 pages.
Chinese Office Action dated Jul. 17, 2017 for Chinese Application No. 201410096590.2, 21 pages (with English translation).
Chinese Office Action dated Jul. 3, 2017 for Chinese Application No. 201410096551.2, 18 pages (including English translation).
Japanese Office Action dated Aug. 6, 2017 for Japanese Application No. 2014-513700, 41 pages (including English translation).
Taiwanese Office Action dated Oct. 23, 2017 for Taiwanese Patent Application No. 103109550, 12 pages (including English translation).
Extended European Search Report dated Nov. 3, 2017 for European Patent Application No. 14000952.3, 10 pages.
Office Action dated Oct. 6, 2017 for U.S. Appl. No. 15/587,560, 47 pages.
Korean Office Action dated Sep. 22, 2017 for Korean Application No. 10-2013-7007430, 5 pages (including English translation).
Korean Office Action dated Oct. 27, 2017 for Korean Application No. 10-2011-0069311, 6 pages (including English translation).
Korean Office Action for Korean Patent Application No. 10-2013-7035133 dated Apr. 10, 2018, 9 pages (including English translation).
Second Office Action received for Chinese Patent Application No. 201410096590.2 dated Apr. 16, 2018, 10 pages (including English translation).
Korean Office Action for Korean Patent Application No. 10-2013-7007430 dated Mar. 31, 2018, 6 pages (including English Translation).
Search Report received for Chinese Application Serial No. 201410364826.6 dated Apr. 10, 2018, 1 page.

(56) References Cited

OTHER PUBLICATIONS

Notice of Allowance received for U.S. Appl. No. 14/587,711 dated May 9, 2018, 26 pages.
Notice of Allowance received for U.S. Appl. No. 15/451,045 dated Jun. 20, 2018, 24 pages.
Chinese Office Action and Search Report for Chinese Patent Application No. 201510067038.5 dated Jun. 29, 2018, 29 pages (including English translation).
Chinese Office Action and Search Report for Chinese Patent Application No. 201510067803.3 dated Jun. 29, 2018, 24 pages (including English translation).
Chinese Office Action for Chinese Patent Application No. 201410364826.6 dated Apr. 18, 2018, 11 pages (including English translation).
Office Action dated Jul. 6, 2018 for U.S. Appl. No. 15/587,560, 182 pages.
Communication under rule 69 EPC dated Dec. 4, 2017 for European Patent Application No. 14000952.3, 2 pages.
Office Action dated Oct. 12, 2017 for U.S. Appl. No. 14/587,711, 25 pages.
Office Action dated Feb. 15, 2018 for U.S. Appl. No. 15/451,045, 130 pages.
European Office Action for Application No. 11005649.6 dated Apr. 4, 2017, 12 pages.
Office Action issued for U.S. Appl. No. 13/149,757 dated Jun. 19, 2012, 11 pages.
Office Action issued for U.S. Appl. No. 14/887,050 dated Mar. 11, 2016, 12 pages.
Taiwanese Office Action for Taiwanese Patent Application No. 103125090 dated Jan. 2, 2018, 15 pages (including English translation).
Chinese Office Action for Chinese Patent Application No. 201410096551.2 dated Mar. 5, 2018, 6 pages (including English translation).
Taiwanese Office Action and Search Report for Taiwanese Patent Application No. 104104033 dated Aug. 1, 2018, 16 pages (including English translation).
Chinese Office Action for Chinese Patent Application No. 201410096590.2 dated Nov. 15, 2018, 8 pages (including English translation).
Taiwanese Office Action and Search Report for Taiwanese Patent Application No. 104104034 dated Oct. 29, 2018, 22 pages (including English translation).
Final Office Action dated Feb. 7, 2019 for U.S. Appl. No. 15/587,560, 96 pages.
Chinese Search Report for Chinese Patent Application No. 201410364826.6 dated Feb. 25 2019, 2 pages.
Chinese Office Action for Chinese Patent Application No. 201410364826.6 dated Mar. 5 20199, 6 pages.
Notice of Allowance received for KR Application No. 10-2013-7035133 dated Oct. 26, 2018, 2 pages.
Notice of Allowance received for TW Application No. 103109550 dated Mar. 30, 2018, 3 pages.
U.S. Appl. No. 61/785,979 filed Mar. 14, 2013.

\* cited by examiner

SCALABLE SILICON BASED RESISTIVE MEMORY DEVICE

CROSS-REFERENCE TO RELATED APPLICATIONS

This application claims priority to, and the benefit of, U.S. Provisional Application Ser. No. 61/937,417, filed Feb. 7, 2014, and entitled "SCALABLE SILICON BASED RESISTIVE MEMORY DEVICE," the entirety of which is expressly incorporated herein by reference.

TECHNICAL FIELD

This disclosure relates generally to electronic memory, for example, the disclosure describes a scalable silicon based resistive memory device.

BACKGROUND

Resistive memory devices represent a recent innovation within the field of integrated circuit technology. While much of this technology is in the development stages, various technological concepts for proposed resistive memory devices and fabrication of the same have been demonstrated by the inventors. The inventors believe that various resistive memory technologies and various techniques for fabricating various resistive memory devices show compelling evidence to hold substantial advantages over competing technologies in the semiconductor electronics industry.

Over time, advancement in technology has provided an increase in a number of semiconductor devices, such as transistors, that can be fabricated on a given geometric area of a semiconductor chip. An implication of increasing the number of semiconductor devices is increasing memory capacity and processing power for the semiconductor chip and associated electronic devices.

In light of the above, the inventors desire to continue developing practical utilization and fabrication of resistive memory technology.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Aspects of the subject disclosure provide for a scalable silicon based resistive memory device. An embodiment relates to a memory device that can include a first metal layer formed over a substrate comprising one or more complementary metal-oxide semiconductor devices. The memory device can also include a via device that connects at least a portion of the first metal layer and at least another portion of a second metal layer. The first metal layer can include a first thickness having an edge thereof that serves as an electrode for a memory cell formed by the via device. Further, the memory cell can scale as a function of the first thickness and at least in part independent of a minimum feature size of the memory device.

In an implementation, the memory cell can scale to a limit defined at least in part by a dimension of the via device. According to another implementation, the memory cell can scale to a limit defined by the first thickness equal to about 5 nanometers. In a further implementation, the minimum feature size of the integrated circuit fabrication equipment is as large as 248 nanometers and the memory cell scales at least to about a 20 nanometer device.

According to an implementation, the via device can include a liner that can include at least one select layer and at least one switch layer. Further to this implementation, the liner can be formed of a material selected from SiOx, SiOx with TiOx, SiOx with AlOx, or combinations thereof.

According to some implementations, the via device can include a collar that comprises conducting material.

According to other implementations, the via device can be filled with a material selected from Al, Al and Cu, Al with TiN, Al with Ti or TiN, TiN, Al and Cu or TiN, other suitable compounds or alloys of Al, Cu, or Ti, or the like, or suitable combinations thereof.

In accordance with some implementations, the first metal layer can be formed of material selected from W, Al, or suitable combinations thereof. Further, the second metal layer can be formed of material selected from Al or TiN, or suitable combinations thereof.

Another aspect relates to a method for fabricating a memory device. The method can include providing a bottom electrode over a top surface of a substrate and providing an insulator layer over the bottom electrode. The method can also include forming a via device through a portion of the insulator layer and through a portion of the bottom electrode. Further, the method can include disposing a resistive switching material with a subset of the via device and backfilling a remaining subset of the via device with an active metal. Further, the method can include forming an active metal layer above the insulating layer and the via device, and patterning the active metal layer. The resistive switching material and bottom electrode can form a resistive memory cell that scales at least in part as a function of a thickness of the bottom electrode layer.

According to an implementation, the memory cell scales to a limit defined at least in part by a dimension of the via device. According to another implementation, the memory cell scales to a limit defined by the thickness of the bottom electrode within about 5 nanometers. In accordance with a further implementation, the memory cell scales at least to a 20 nanometer device, wherein the minimum feature size of integrated circuit fabrication equipment is up to 248 nanometers.

According to other implementations, providing the bottom electrode over the top surface of the substrate can include forming the bottom electrode over the top surface of a complementary metal-oxide semiconductor circuitry layer.

A further aspect relates to a memory cell that can include a substrate that can include one or more complementary metal-oxide semiconductor devices. The memory cell can also include a first metal layer formed over the substrate. The memory cell can also include a via device that connects at least a portion of the first metal layer and at least another portion of a second metal layer. The first metal layer can include a first thickness having an edge thereof that operates as an electrode for a memory cell formed by the via device. The memory cell scales as a function of the first thickness and at least in part independent of a minimum feature size of the memory cell.

According to an implementation, the memory cell scales to a limit defined at least in part by a dimension of the via device. According to another implementation, the memory cell scales to a limit defined by the first thickness equal to about 5 nanometers.

In accordance with an implementation, another minimum feature size of an integrated fabrication equipment is no larger than about 248 nanometers. This minimum feature size dimension can be a smallest line thickness or point width that can be optically resolved by photolithographic equipment employed for the fabrication equipment, as one example. Further to this implementation, the memory cell scales to at least to about a 20 nanometer device, while utilizing the fabrication equipment with minimum (e.g., resolvable) feature size as large as about 248 nanometers.

According to an aspect, the via device can include a liner that comprises at least one select layer and at least one switch layer. According to another aspect, the via device can include a collar that comprises conducting material.

In accordance with still another aspect, the via device can be filled with a material selected from Al, Al and Cu, Al with TiN, Al with Ti or TiN, TiN, Al and Cu or TiN, or suitable combinations thereof.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects, and advantages of the instant invention will be apparent upon consideration of the following detailed description, taken in conjunction with the accompanying drawings, in which like reference characters refer to like parts throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Figure 1:
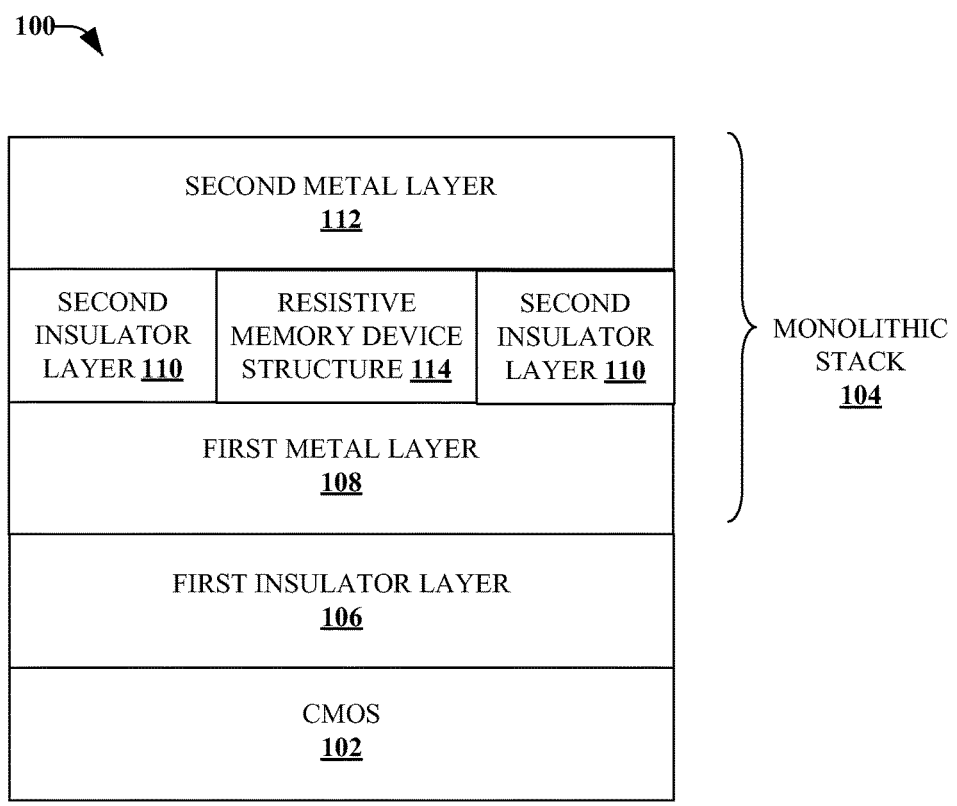
FIG. 1 depicts a block diagram of an example memory cell, according to one or more embodiments of the subject disclosure.

This disclosure relates to two-terminal memory cells employed for digital or multi-level information storage. In some embodiments, the two-terminal memory cells can include a resistive technology, such as a resistive-switching two-terminal memory cell. Resistive-switching two-terminal memory cells (also referred to as resistive-switching memory cells or resistive-switching memory), as utilized herein, comprise circuit components having conductive contacts with an active region between the two conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the two conductive contacts. The suitable electrical signal can be a voltage value, a current value, a voltage or current polarity, an electric or magnetic field, or the like, or a suitable combination thereof. An example of a resistive switching two-terminal memory device, though not exhaustive, can include a resistive random access memory (RRAM).

Embodiments of the subject disclosure can provide a filamentary-based memory cell. One example of a filamentary-based memory cell can comprise: a contact material layer (e.g., a p-type (or n-type) silicon (Si) bearing layer (e.g., p-type or n-type polysilicon, p-type polycrystalline SiGe, etc.), Ti, W—Ti, TaN, or the like), a resistive switching layer (RSL) including a plurality of defect locations, and an active metal layer to facilitate generation of particles (e.g., metal ions) within, or at a boundary of, the RSL. Under suitable bias conditions (e.g., programming voltage), the particles (e.g., metal ions) can migrate to the defect locations within the RSL to provide filament forming ions to the RSL. Upon removal of the bias condition, the particles (e.g., metal ions) remain trapped within the defect locations. In some embodiments, the particles can become neutral particles (e.g., metal atoms) that are static within the defect locations in absence of the suitable bias conditions. In response to a suitable reversing signal (e.g., erase signal, deformation signal, etc.), the metal ions can leave the defect sites, migrating back toward the active metal layer, or diffusing throughout the RSL, or the like, or a suitable combination thereof.

The RSL (which can also be referred to in the art as a resistive switching media (RSM)) can comprise, for example, an undoped amorphous Si layer, a semiconductor layer having intrinsic characteristics, a Si sub-oxide (e.g., SiOx wherein x has a value between 0.1 and 2) a non-stoichiometric oxide, a metallic oxide (e.g. Zinc Oxide) and so forth. Other examples of materials suitable for the RSL could include $Si_X Ge_Y O_Z$ (where X, Y and Z are respective suitable positive integers), a silicon oxide (e.g., $SiO_N$, where N is a suitable positive integer), amorphous Si (a-Si), amorphous SiGe (a-SiGe), $TaO_B$ (where B is a suitable positive integer), $HfO_C$ (where C is a suitable positive integer), $TiO_D$ (where D is a suitable positive integer), and so forth, or a suitable combination thereof.

Examples of the active metal layer can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), and palladium (Pd). Other suitable conductive materials, as well as compounds or combinations of the foregoing or similar materials can be employed for the active metal layer in some aspects of the subject disclosure. In some embodiments, a thin layer of barrier material composed of Ti, TiN, or the like, may be disposed between the RSL and the active metal layer (e.g., Ag, Al, and so on). Details pertaining to additional embodiments of the subject disclosure similar to the foregoing example(s) can be found in the following U.S. patent applications that are licensed to the assignee of the present application for patent application Ser. No. 11/875,541 filed Oct. 19, 2007, application Ser. No. 12/575,921 filed Oct. 8, 2009, and the others cited above, each of which are incorporated by reference herein in their respective entireties and for all purposes.

To program a filamentary-based resistive switching memory cell, a suitable program voltage(s) can be applied across the memory cell causing a conductive path or a filament of varying width and length to form within a relatively high resistive portion of the memory cell (e.g., the resistive switching layer). This causes the memory cell to switch from a relatively high resistive state, to one or more relatively low resistive states. In some resistive-switching devices, an erase process can be implemented to deform the conductive filament, at least in part, causing the memory cell to return to the high resistive state(s) from the low resistive state(s). This change of state, in the context of memory, can be associated with respective states of a binary bit or multiple binary bits. For an array of multiple memory cells, a word(s), byte(s), page(s), block(s), etc., of memory cells can be programmed or erased to represent zeroes or ones of binary information, and by retaining those states over time in effect storing the binary information. In various embodiments, multi-level information (e.g., multiple bits) may be stored in respective memory cells.

Referring now to the drawings, FIG. 1 depicts a block diagram of an example memory cell 100 using integrated-circuit foundry compatible processes, according to one or more embodiments of the subject disclosure. The memory cell 100 can include a complementary metal-oxide semiconductor (CMOS) layer 102 and a monolithic stack 104. In various embodiments, the CMOS layer 102 may include memory driver circuitry, processing logic, gate arrays, or the like.

For example, in one embodiment, a substrate could be provided that includes one or more CMOS devices formed therein. In an alternative embodiment, the one or more CMOS devices can be fabricated on, or within, the substrate. In another embodiment, the substrate can be provided with one or more CMOS devices formed therein and further comprising a fabrication of one or more additional CMOS devices on, or within, the substrate.

Prior to fabrication of the monolithic stack 104, a first insulating layer 106 may be formed over CMOS layer 102. The monolithic stack 104 can include multiple layers that are fabricated in sequence over the CMOS layer 102 and the first insulating layer 106. Further, one or more additional layers, not specifically depicted, can be included in the monolithic stack 104 according to alternative embodiments (e.g., see FIGS. 2 and 3, infra).

According to some embodiments, the multiple layers of the monolithic stack 104 can include a first metal layer 108, a second insulating layer 110, and a second metal layer 112. The first metal layer 108 can be formed of W, Al, or a similar material. The second metal layer 112 can be formed of Al with TiN. Further, a resistive memory device structure 114 can be fabricated within the second insulating layer 110. The resistive memory device structure 114 can create a contact between the first metal layer 108 and the second metal layer 112.

The resistive memory device structure 114 can be fabricated within a thermal budget of the CMOS layer 102. For example, the resistive memory device structure 114 can be fabricated at a temperature of about 450 degrees Celsius. According to an embodiment, the temperature can be about 450 degrees Celsius or lower. In various embodiments, the resistive memory device structure can be fabricated at a range of temperatures selected from a range group consisting of about 450 degrees and 400 degrees Celsius, about 400 degrees and 350 degrees Celsius, about 300 degrees and 350 degree Celsius, and so on.

The inventors believe the dielectric constant imposes a constraint and therefore constructing a resistive memory device with a low thermal budget can provide lower fabrication costs as compared to other high temperature memory fabrication processes that have high temperature components and that must be fabricated separate from the CMOS, as discussed above, and not as a monolithic process over the CMOS chip.

In an implementation, the resistive memory device structure 114 can retain a defined distance between the first metal layer 108 and the second metal layer 112. For example, as the resistive memory device structure 114 is formed, a distance between the first metal layer 108 and the second metal layer 112 stays approximately the same. In other words, the distance between the first metal layer 108 and the second metal layer 112 does not become appreciable larger, if at all, within an established fabrication process as a result of the inclusion of the resistive memory device structure 114. In some embodiments, the distance between the first metal layer 108 and the second metal layer 112 is the same as the distance between the second metal layer 112 and a third metal layer.

In an aspect, the resistive memory device structure 114 can be implemented in a pillar-type device. For example, the pillar-type device can include a pillar (of a conductive and/or resistive material) that is formed on the first metal layer 108. The pillar-type device can also include a collar (e.g., oversized layer) that is formed of layers of materials. In some embodiments, the layers of materials are cylindrical-shaped and are approximately co-linear, such as a first cylinder and a second cylinder. The second cylinder can contact the second metal layer 112.

In other embodiments, as utilized herein, the term cylinder can refer to a polygonal or approximately polygonal shape. In another example, the term cylinder can refer to an ovoid or approximately ovoid shape, or the like. Further, the term cylinder can refer to a cone shape. In another example, a cylinder can be approximately a multiple sided polygon (for instance, a polygon having at least one partially rounded edge, or a polygon having at least one partially rounded corner, or multiple partially rounded edges, or multiple partially rounded corners, or a combination of the foregoing). In another example, a cylinder can have at least one side that is non-linear, such as curved side. In a further example, a cylinder can have some non-sharp edges and/or some non-sharp sides. In yet another example, a cylinder can be an object that is approximately polygonal, an extruded polygon having at least one non-linear side, or an extruded polygon having at least one non-sharp edge. In some embodiments, an area of the cross-sections may be substantially similar, or different.

In one example, a first cylinder can have a first side and a second side, located on opposite ends of the first cylinder. The second cylinder can have a first surface and a second surface, located on opposite sides of the second cylinder. A first side of the first cylinder can contact the pillar and the second side of the first cylinder can contact the second surface of the second cylinder. The first side of the second cylinder can contact the second metal layer 112 (see, e.g., cut-out section 318 of FIG. 3, infra).

According to an embodiment, the resistive memory device structure 114 can be implemented in a pillar-like device that includes a pillar structure. The pillar structure can be formed of conducting material. In some embodiments, the pillar structure can include a prism structure (parallel bases) with a cross-sectional pattern such as a circle, approximately polygonal, ovoid, or the like. In one example, a first cylinder is formed of switching material and a second cylinder is formed of another conducting material. In an aspect, the conducting material of the pillar structure and the second cylinder are different materials. However, according to some aspects, the material of the pillar structure and the second cylinder can be the same material or a similar material.

According to an implementation a pillar via liner can be formed of a material selected from, among others: Silicon Oxide (SiOx), a compound of SiOx and Titanium Oxide (TiOx), and a compound of SiOx and Aluminum Oxide (AlOx), or a similar material(s), or suitable combinations thereof. In accordance with an implementation, the via device can be filled with a material selected from, among others: Al, Al and Cu, Al with TiN, Al with Ti or TiN, TiN, Al and Cu or TiN, or suitable combinations thereof, or a similar material(s).

In some implementations, the first cylinder can have a first thickness and the second cylinder can have a second thickness, different from the first thickness. Thus, the first cylinder can be thicker than the second cylinder. However, according to other aspects, the first cylinder can be thinner than the second cylinder.

Figure 2:
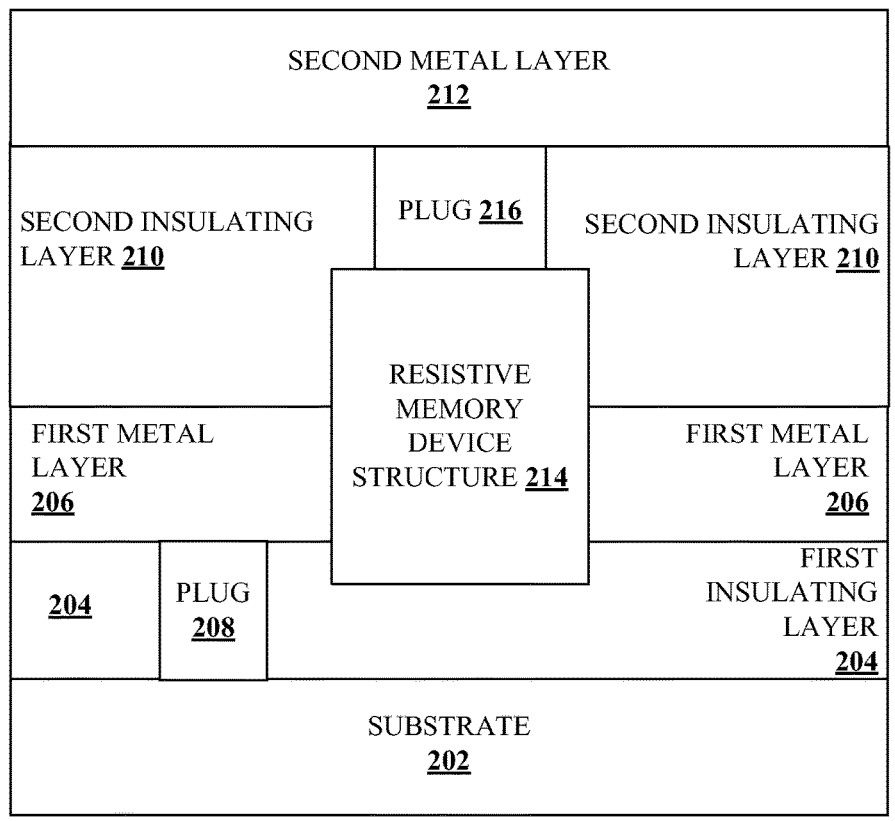
FIG. 2 depicts a block diagram of an example memory device according to one or more embodiments of the subject disclosure.

FIG. 2 depicts a block diagram of another example memory cell 200 using integrated-circuit foundry compatible processes, according to one or more embodiments of the subject disclosure. Memory cell 200 can include a substrate 202, a first insulating layer 204, and a first metal layer 206 formed over a top surface of the first insulating layer 204 and the substrate 202. In various disclosed embodiments, the substrate 202 can be a complementary metal oxide semiconductor (CMOS) substrate having one or more CMOS-compatible devices. Further, the first metal layer 206 can be formed of W, Al, or a similar material In various embodiments, the CMOS layer 102 may include memory driver circuitry, processing logic, gate arrays, or the like. For example, in one embodiment, a substrate could be provided that includes one or more CMOS devices formed therein. In an alternative embodiment, the one or more CMOS devices can be fabricated on, or within, the substrate. In another embodiment, the substrate can be provided with one or more CMOS devices formed therein and further comprising a fabrication of one or more additional CMOS devices on, or within, the substrate.

A first conductive plug 208 can be formed within the first insulating layer 204. The first conductive plug 208 (e.g., W) can connect the substrate 202 and the first metal layer 206.

Formed on a top surface of the first metal layer 206 can be a second insulating layer 210. Formed over the second insulating layer 210 can be a second metal layer 212. The first metal layer 206, the second metal layer 212, and subsequent metal layers can be formed of metals. Further, a resistive memory device structure 214 can be formed within the second insulating layer 210. Further, as illustrated, the resistive memory device structure 214 can be formed within the first metal layer 206 and at least a portion of the first insulating layer 204. The resistive memory device structure 214 can create a contact between the first metal layer 206 and the second metal layer 212, such as with a second conductive plug 216 (e.g., W). The resistive memory device structure 214 can be formed using integrated-circuit foundry compatible processes (e.g., using existing integrated-circuit foundry tooling), according to the various aspects discussed herein.

In accordance with an aspect, forming the resistive memory device structure 214 can include retaining a defined distance between the first metal layer 206 and the second metal layer 212. For example, while forming the resistive memory device structure 214 the distance that separates the first metal layer 206 and the second metal layer 212 stays about the same as the distance before the resistive memory device structure 214 is formed.

According to another implementation, the resistive memory device structure 214 can be implemented in a via-type device. The via-type device can be one of a multitude of difference structures, including, but not limited to, a via structure, a channel, a trough, and so on. The via structure can be lined with aluminum, copper, silver, a suitable compound thereof, or suitable combinations of the foregoing. Further, the via structure can include at least a portion that is fabricated with conducting material.

Figure 3:
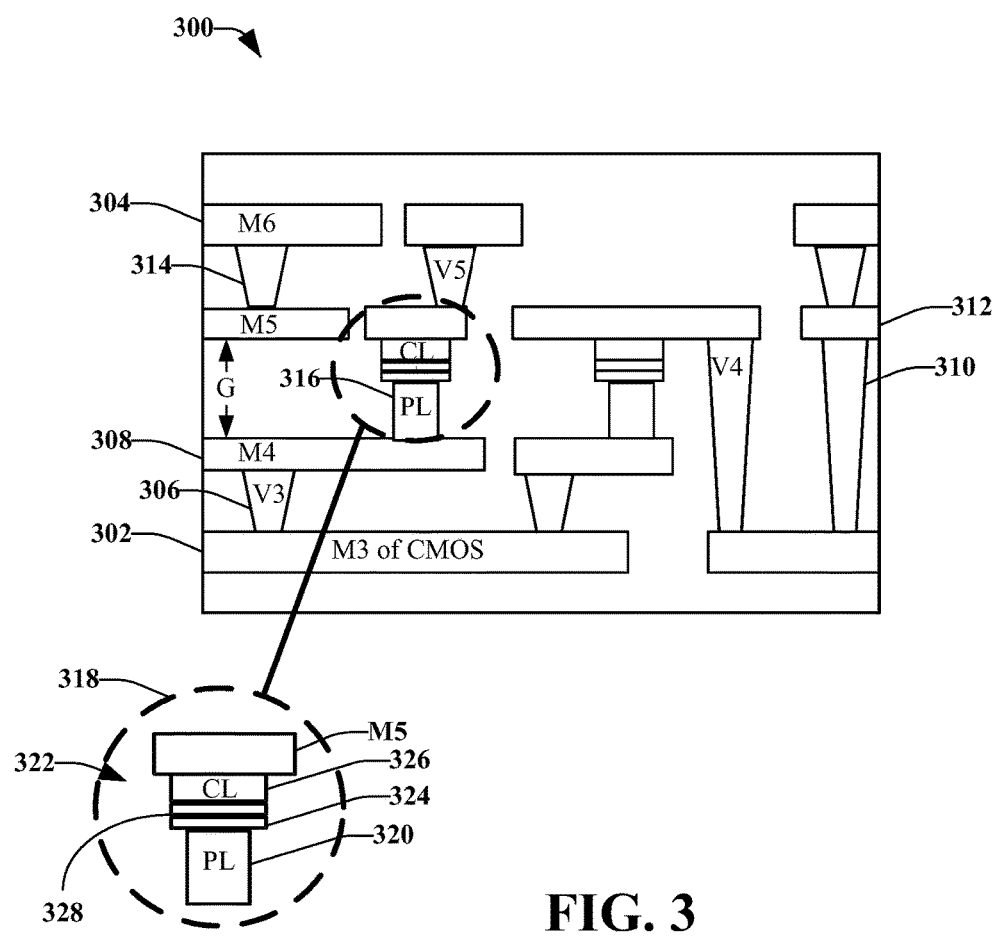
FIG. 3 depicts a block diagram of a cross-sectional view of an intermediate stage in the manufacture of an example memory architecture for a memory device, according to one or more embodiments of the subject disclosure.

FIG. 3 depicts a block diagram of a cross-sectional view of an intermediate stage in the manufacture of an example memory architecture 300 for a memory device, according to one or more embodiments of the subject disclosure. The memory architecture 300 can comprise resistive memory. One or more vertical contacts, for example, V4 contacts 310, of the memory architecture 300 can be replaced with a pillar-type device or a via-type device, according to various aspects.

It is noted that the memory architecture 300 is shown built between a first set of metals, M3 metal layers 302, and a second set of metals, M6 metal layers 304. Various components of the memory architecture 300 that are included below the M3 metal layers 302 (e.g., metals M1, metals M2, gate level components, CMOS circuitry, and so on) are not illustrated or described for purposes of simplicity. Further, additional metal layers above the M6 metal layers 304 can be included in the memory architecture 300, but are not illustrated or described for purposes of simplicity.

A first set of vertical contacts, V3 contacts 306, connect portions of the M3 metal layers 302 to portions of a third set of metals, M4 metal layers 308. Further, a second set of vertical contacts, V4 contacts 310, can connect portions of the M3 metal layers 302 to portions of a fourth set of metals, M5 metal layers 312. Further, another set of the V4 contacts 310 (though not specifically depicted) can connect portions of the M4 metal layers 308 to portions of the M5 metal layers 312. In addition, a third set of vertical contacts, V5 contacts 314, can connect portions of the M5 metal layers 312 to portions of the M6 metal layers 304.

Illustrated between portions of the M4 metal layers 308 and portions of the M5 metal layers 312, is a memory element. In accordance with an implementation, the memory element can be a pillar-type device 316. It is noted that although the pillar-type device 316 is illustrated between the M4 metal layers 308 and the M5 metal layers 312, one or more pillar-type devices can be formed in other places within the memory architecture 300. For example, one or more pillar-type devices can be formed between the M3 metal layers 302 and the M4 metal layers 308, between the M5 metal layers 312 and the M6 metal layers 304, or between other sets of metals, or other metal backend layers (not shown).

Further, pillar-type devices can be formed between multiple sets of metals. For example, at least one pillar-type device can be formed between the M4 metal layers 308 and the M5 metal layers 312 and at least another pillar-type device can be formed between the M5 metal layers 312 and the M6 metal layers 304, or between other metals. Thus, the pillar-type device(s) can be sandwiched between any suitable metal layers including any suitable further backend metal layers, although such metal layers are not illustrated or described for purposes of simplicity.

During the process of fabricating the memory element between sets of the metals (e.g., between the M4 metal layers 308 and the M5 metal layers 312), the spacing between the metal layers does not widen or narrow in at least some disclosed embodiments. For example, in such embodiments, the height between the respective M4 metal layers 308 and the respective M5 metal layers 312 is substantially the same as the height between the M3 metal layers 302 and the M4 metal layers 308. Further, the height of the pillar-type device, which can include a pillar (PL) and a collar (CL) and forms the memory element, can have a total height that was the same, or substantially the same, as a gap between the respective M4 metal layers 308 and the respective M5 metal layers 312 before placement of the memory element. In such a manner, existing dielectrics (e.g., the dielectric used before placement of the memory element, or pillar-type device, between the respective metal layers) can continue to be utilized. Further, various other existing processes used in an integrated circuit can continue to be utilized to manufacture the example memory architecture 300.

Thus, as discussed herein, the resistive memory device can be integrated monolithically on top of a substrate. In various disclosed embodiments, the substrate can be a CMOS substrate having one or more CMOS-compatible devices. In one or more embodiments, disclosed memory device(s) can be resistive-switching two-terminal memory devices compatible in part or in full with existing CMOS fabrication techniques. Accordingly, some or all of the disclosed memory devices can be fabricated with low fabrication costs, limited retooling, and the like, resulting in high density and high efficiency two-terminal memory that the inventors believe can be fabricated and brought to market with fewer fabrication problems than can exist with other memory devices.

Other processes used to integrate a resistive memory might cause a change to the dielectric thicknesses or to critical dimensions in the backend and, therefore, a capacitance can change. Therefore, the electrical design documents for these other processes have to be changed, resulting in the consumption of valuable resources (e.g., time, costs, and so on). The one or more aspects disclosed herein minimize these changes by adding or forming the resistive memory on top of the CMOS circuitry. Further, the inter-layer dielectric (ILD) thickness is maintained the same (or similar) between backend metal layers (e.g., the M4 metal layers 308 and the M5 metal layers 312, as illustrated).

Further, as illustrated by the cut-out section 318 (dotted circle), the pillar-type device, which can be placed between respective sets of the metals, can include a base 320 (e.g., having a pillar shape, or approximately pillar shape as one example) labeled as PL and a stack of material layers 322 over the base 320 (labeled as CL). For example, the base 320 can be placed, followed by a stack of material layers 322 that can comprise one or more components of the material layers. In one example, a cross-section shape of base 320 or stack of material layers can be a cylindrical, approximately cylindrical, circular or approximately circular, ovoid or approximately ovoid, a polygonal cross-section or approximation of a polygon, a three-dimensional object having a cylindrical cross-section, or in some embodiments, the cross section can be an irregular shape having no specific geometry, and so on. In one aspect the stack of material layers 322 can have one three-dimensional shape. In another aspect, the stack of material layers 322 can comprise multiple layers of different materials stacked or placed on top of each other. In another aspect, the stack of material layers 322 can comprise multiple cylindrically shaped layers, or approximate cylinder layers, or other a stack of other suitably shaped layers.

In various embodiments, as illustrated in FIG. 3, the stack of material layers 322 includes a resistive switching material layer 324, such as undoped amorphous silicon material layer non-stoichiometric silicon oxide, or the like. The stack of material layers 322 also includes an active metal layer 326 (e.g., Ag, Au, Al, or the like). In some embodiments, an optional thin barrier material layer 328 is between the resistive switching material 324 and the active metal material layer 326, such as Ti, W, TiN, or the like. In various embodiments, an adhesion or barrier material layer (not depicted) may be disposed between active metal layer 326 and M5 layer. The adhesion/barrier material layer may be Ti, W, W—Ti, TiN, TaN, or the like. In various embodiments, base 320 may be of a conductive material (e.g., Ti, W, TiN, W—Ti, TaN or the like). Various embodiments are compatible with metal layers, e.g. M3, M4, M5, etc. comprising copper, aluminum, or the like. Some embodiments can be compatible with one metallization scheme (e.g., Aluminum) whereas other embodiments can be compatible with another metallization scheme (e.g., Copper), where necessitated by foundry compatibility constraints of a commercial semiconductor fabrication foundry.

In an implementation, one or more respective layers of the stack of material layers 322 can be of different sizes, having different dimensions. For example, a first layer can have a larger width, thickness, perimeter, etc., than a second layer of stack of material layers 322. In another example, the first layer can be thinner than the second layer of stack of material layers 322. In yet another example, base 320 can have a different cross-section perimeter (e.g., width, etc.) as compared to one or more layers of stack of material layers 322. A purpose of providing a different perimeter length for the base 320 as compared to the stack of material layers 322 (e.g., leading to a narrower base 320 and wider stack of material layers 322, as depicted by the example embodiment of FIG. 3) can be to minimize leakage paths along sidewalls and provide better encapsulation of materials.

In some embodiments, the base 320 can also comprise conducting material, such as a p-type polycrystalline silicon p-type polycrystalline, SiGe, and the like. On the bottom of the collar (e.g., at least a portion of a first cylinder) is a switching material (e.g., an RSL or RSM, as described herein). However, the switching material can be at a different layer than the bottom of the collar. Further, at the top of the collar (e.g., at least a portion of a second cylinder) can be a conducting connection, formed of a conducting material.

According to one or more of the disclosed aspects, the materials used are low thermal budget materials that do not impact IC foundry CMOS at sub 45 nm nodes (High K gate dielectric metal gate process). Further, the unit processes are compatible with small nodes without impacting the CMOS circuitry.

With reference to FIG. 3, some resistive memory devices use a pillar and collar type architecture sandwiched between two metal backend layers, for the base 320 and stack of material layers 322. A purpose of breaking the pillar device into at least two concentric cylindrical layers can be to minimize leakage paths along sidewalls and better encapsulation of materials. However, the memory device might be limited by lithography as it relates to scaling. In at least some embodiments of the memory device architecture of FIG. 3, a dimension that establishes a technology node size of a resistive-switching memory device (referred to herein as a critical dimension) formed by the base 320 and stack of material layers 322 can be a common area (e.g., electrically conductive cross sectional area) at an interface of the base 320 and the stack of material layers 322.

Further, scaling to smaller geometrics for a two-terminal memory cell (e.g., RRAM, and so on) can become expensive. With the one or more aspects disclosed herein, it is possible to extend the scalability of the two-terminal memory cell in a manufacturing facility without the need for advanced lithography. For example, an architecture in which a resistive memory cell is formed by a via-related process that removes metal or insulating material, exposing oblique or horizontal sections thereof, can be utilized in alternative or additional embodiments. For instance, a critical dimension of the device can be controlled by a contact area between a surface of the thin bottom electrode layer exposed by the via (e.g., the bottom electrode layer having a thickness controlled by film thickness) and a via liner (e.g., controlled by film thickness). The one or more aspects disclosed herein can also effectively enable scaling two-terminal memory on CMOS by using the same, or a lower, cost and lower resolution lithography tools.

Figure 4:
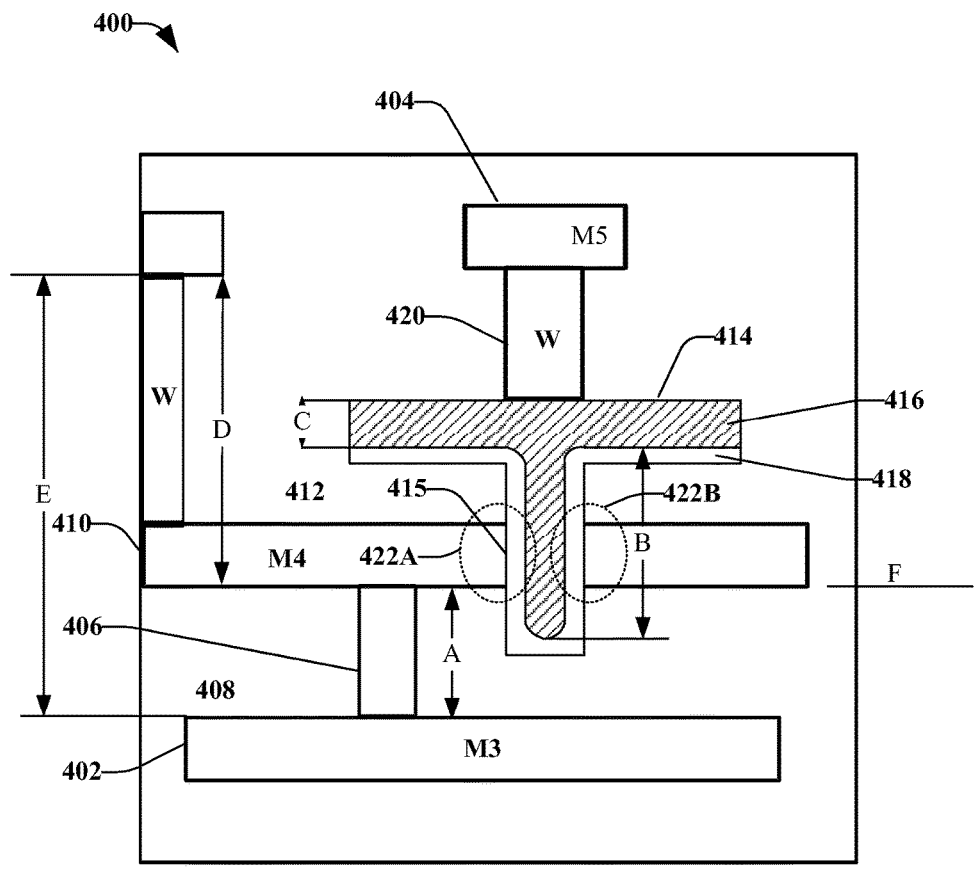
FIG. 4 depicts a block diagram of a cross-sectional view of an intermediate stage in the manufacture of another example memory architecture for a memory device, according to one or more embodiments of the subject disclosure.

FIG. 4 depicts a block diagram of a cross-sectional view of an intermediate stage in the manufacture of another example memory architecture 400 for a memory device, according to one or more embodiments of the subject disclosure. Similar to the memory architecture 300 of FIG. 3, it is noted that the memory architecture 400 is shown built between a first set of metals, M3 metal layers 402, and a second set of metals, M5 metal layers 404. Various components of the memory architecture 400 that are included below the M3 metal layers 402 (e.g., metals M1, metals M2, gate level components, CMOS circuitry (drivers, logic, processors, etc.), and so on) are not illustrated or described for purposes of simplicity. Further, sets of metals above the M5 metal layers 404 can be included in the memory architecture 400, but are not illustrated or described for purposes of simplicity.

A conductive plug 406 (e.g., W) can be formed within a first insulating layer 408. The conductive plug 406 can connect portions of the M3 metal layers 402 with portions of another set of metals, M4 metal layers 410. A second insulating layer 412 can be formed over the M4 metal layers 410. In various embodiments, M4 metal layers 410 may be a conductive layer formed of various metal material(s) (e.g., TiN, W, W—Ti, TaN, Al, or the like), or silicon-containing material (e.g., p-type polycrystalline silicon, p-type SiGe, doped SiGe, or the like).

Formed within the second insulating layer 412 can be a via-type device 414 (e.g., a via, a channel, a trough, and so on). The via-type device 414 can also be formed within the M4 metal layers 410 and the first insulating layer 408, as illustrated. It is noted that although the via-type device 414 is illustrated between a portion of the M4 metal layers 410 and a portion of the M5 metal layers 404, one or more via-type devices can be included in other places within the memory architecture 400. For example, one or more via-type devices can be located between the M3 metal layers 402 and the M4 metal layers 410, between the M5 metal layers 404 and a M6 metal layer (not shown), or between other sets of metal interconnects or metal backend layers (not shown).

Further, additional via-type devices can be included between multiple sets of metal layers. For example, at least one via-type device can be formed between the M4 metal layers 410 and the M5 metal layers 404 and at least another via-type device can be formed between the M5 metal layers 404 and a M6 metal layers (not shown), or between other metals or metal layers. Thus, the via-type device(s) can be sandwiched between any metal layers including any further backend metal layers, although such metal layers are not illustrated.

The via-type device(s) can be formed with suitable etching techniques, grooving techniques, or similar techniques for removing at least a subset of material of stacked semiconductor films or layers. Similar to the memory architecture 300 described with respect to FIG. 3, during the process of inserting via devices(s) between sets of the metal interconnects (e.g., between the M4 metal layers 410 and the M5 metal layers 404), the spacing between the metal layers does not widen or narrow, or does not substantially widen or narrow in at least some disclosed embodiments. For example, the height between the respective M4 metal layers 410 and the respective M5 metal layers 404 can remain constant or substantially constant. For example, the height of the via-type device has a total height that was the same, or substantially the same, as a height between the respective M4 metal layers 410 and the respective M5 metal layers 404 before placement of the via-type device. In such a manner, existing dielectrics (e.g., the dielectric used before placement of the via-type device(s), between the respective sets of metal layers) can continue to be utilized. Further, various other existing processes used in the fabrication of an integrated circuit can continue to be utilized to manufacture the example memory architecture 400.

The via-type device 414 (or multiple via devices), can result in exposed surfaces (e.g., such as an exposed surface 415) of respective ones of the metal layers. Depending on a shape of the etching, trough, grooving, etc., technique used to form a via, the exposed surfaces 415 can be vertical (e.g., looking into the page of FIG. 4), approximately vertical, or at an oblique angle. The via-type device 414 can be etched and filled with one or more materials, which can comprise two or more different materials arranged along a direction at least in part perpendicular to (or approximately perpendicular to) the exposed surface(s) 415. For example, the via-type device 414 can include a first portion 416 formed of a first material. The first portion 416 can be surrounded, at least partially, by a second portion 418 of the via-type device 414, wherein the second portion 418 includes a second material, which can be different from the first material.

In various embodiments, the second portion 418 is a resistive switching material layer, such as undoped amorphous silicon material layer, non-stoichiometric silicon oxide (SiOx), or the like. The first portion 416 may be an active metal layer (e.g., Ag, Au, Al, or the like). The via-type device 414 may also include a thin barrier material layer between the first portion 416 and the second portion 418, such as Ti, W, TiN, or the like, in some embodiments.

The first portion 416 of the via-type device 414 can be conducting. Further, the M4 metal layers 410 can be conducting and the second portion 418 of the via-type device 414 that surrounds the first portion 416 can be formed of a switching material.

In various embodiments, a plug 420 may be formed between the via-type device 414 and the M5 metal layers 404. The plug 420 may be formed of a conductive material (e.g., Ti, W, TiN, W—Ti, TaN, or the like). According to an aspect, the via-type device can be formed using a W plug process to connect to M5, formed of aluminum (Al), copper (Cu), a suitable compound or alloy thereof, or any other suitable metallization scheme. In some embodiments, when Cu is used for M5, an adhesion/barrier material, e.g. (e.g., Ti, W, TiN, W—Ti, TaN, or the like), may be included. For example, as discussed herein, a W plug can be used for making a metal contact. According to an aspect, a via hole, in which the W-plug is to be formed can have sidewalls between which the W plug is placed.

The via-type device 414 (or multiple via devices) can result in exposed sidewall portions of respective ones of the metal layers (e.g. M4). The via-type device 414 can be created at a contact between a thin bottom electrode layer and a thin via liner, which can effectively scale the device without scaling printed features. As compared to FIG. 3, for example, the layer of the M4 metal layer 410 may be thinner than the comparable M4 metal layers 308 of FIG. 3. According to an aspect, the thinner the M4 layer, the smaller the device. Thus, the memory device can be scaled by controlling the metal bottom electrode thickness, which can be controlled down to 50 A or 5 nm, for example, though in other embodiments thinner or thicker M4 layers are anticipated. Examples of materials for the bottom electrode layer can include, among others: tungsten (W), aluminum (Al), or the like, or suitable combinations thereof.

Further, the pillar-type device 316 of FIG. 3 is changed to a via-type device 414. The liner of the via-type device 414 can comprise select and switching layers. Further, a collar material of the via-type device 414 can comprise a simple conducting material (e.g. 416). Examples of materials for the pillar changed to via liner layer can include, a resistive switching material 418, e.g.: Silicon Oxide (SiOx), a compound of SiOx and Titanium Oxide (TiOx), and a compound of SiOx and Aluminum Oxide (AlOx), or the like, or suitable or combinations thereof. Examples of materials for overlying the resistive switching material 418, sometimes filling the via can include an active metal material, e.g. Al, a compound of Al, Au, Copper (Cu), a compound of Al, Ti, and Titanium nitride (TiN), and a combination of Al and Cu, Al and Cu. In some examples, the top electrode can be formed of many other materials including tantalum (Ta), tantalum nitride (TaN), Cu, or the like, or suitable combinations thereof.

As illustrated, the via can be both inside and outside of the bottom electrode metal (e.g., the M4 metal layers 410). The scaling limit can be the via dimension that is inside the M4 metal layers 410, which can affect a metal resistance of the M4 metal layers. For example, an important dimension of via device can be a measurement of the size of a feature of the device. In this example, the feature is a via. Vias are usually circular in shape, thus it can be a measure of the diameter. However, vias can also be oblong-shaped or a different shape. Thus, according to some aspects, the via important dimension could be a measure of the length, width, or both the length and the width. In accordance with an aspect, the resistivity of the via can be modulated by changing the size of this feature.

According to some implementations, a via can be drilled through a multiple bottom electrode (BE) stack (e.g., multiple metal layers), which can allow for three (or another number) of devices to be included on the same via. According to some aspects, the bottom electrode can be a semiconductor. A sharpness of the bottom electrode can provide for an enhanced electrical field (E-field) that can reduce the via form (e.g., width or length) as compared to a planar device.

According to one or more of the disclosed aspects, the memory device architecture utilizes smaller CMOS devices and can improve memory efficiency. Further, the memory device architecture of the various aspects disclosed herein can be made using materials that are already existing in most IC foundry facilities. Further, the integration scheme can enable device scaling to 5 nm without the need to use a manufacturing toolset that is typical of a 5 nm technology node (e.g., no retooling is needed). For example, with 44 nm or 193 nm lithography toolset, a sub 20 nm device can be made using the disclosed aspects.

According to an implementation, the pillar-type device or via-type device may include one or more materials representing a selector device, such as a Crossbar FAST™ device. In some embodiments, the selector device can include a selector layer the can be a non-stoichiometric material. Examples of suitable materials for the selector layer can include $SiO_X$, $TiO_X$, $AlO_X$, $WO_X$, $Ti_XN_YO_Z$, or the like, or suitable combinations thereof, where x, y and z can be suitable non-stoichiometric values. In at least one embodiment of the present disclosure, the select layer can be doped with a metal(s) during fabrication, to achieve a target resistance or conductance characteristic. Further to the above, the selector device can comprise ion conductor layer$_1$ and ion conductor layer$_2$. Ion conductor layer$_1$ or ion conductor layer$_2$ can comprise a solid electrolyte (e.g., Ag—Ge—S, Cu—Ge—S, Ag—Ge—Te, Cu—Ge—Te, etc.) or a metal-oxide alloy (e.g., $AgSiO_2$, and so forth).

Figure 4A:
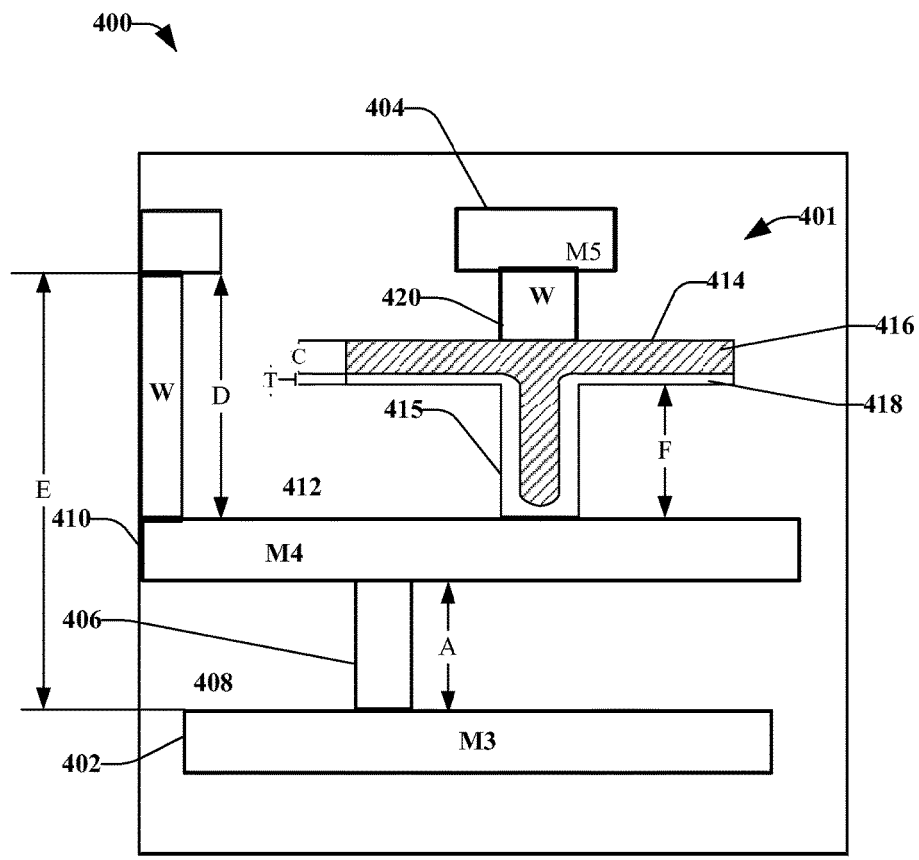
FIG. 4A illustrates a block diagram of a cross-sectional view of an example memory architecture according to an alternative embodiment(s).

FIG. 4A illustrates an example diagram 400 of a memory cell structure 401 according to alternative or additional embodiments of the present disclosure. Memory cell structure 401 can be constructed among metal layers (e.g., back-end-of-line metal layers) of a semiconductor device. In diagram 400, the depicted metal layers include metal layer M3 402, metal layer M4 410 and metal layer 404 (referred to collectively as metal layers 402, 404, 410), however it should be appreciated that other memory layers can be included that are not depicted by diagram 400 (e.g., M1, M2, M6, . . . ).

In various embodiments, memory cell structure 401 can be constructed between metal layers M4 410 and M5 404. In further embodiments, a memory cell structure 401 can be constructed between other metal layers depicted by FIG. 4A (e.g., between metal layer M3 402 and metal layer M5 404; between metal layer M3 402 and metal layer M4 410) or metal layers not depicted therein. Electrically insulating material is provided between metal layers 402, 404, 410, such as insulating material 408 between metal layers M3

402 and M4 410, and insulating material 412 between metal layers M4 410 and metal layers M5 404.

Memory cell structure 401 is fabricated within insulating material 412. A via, trench, groove, etc., 415 can be formed within the insulating material 412. The via 415, initially formed, represents a gap in insulating material 412. A via liner 418 is formed over the gap in insulating material 412. Via liner 418 can be deposited as a thin film, in various embodiments, that provides a relatively uniform thickness along a surface of insulating material 412 exposed by via 415. Additionally, a fill material 416 can be deposited over via liner 418. In some embodiments, a conductive plug 420, such as W or other suitable electrical conductor, can be formed above fill material 416. Conductive plug 420 can have a thickness (e.g., height) selected to provide electrical continuity between a top surface of fill material 416 and a bottom surface of metal layer M5 404. Accordingly, conductive plug 420 can have different thicknesses based on a predetermined distance, D, between metal layer M4 410 and metal layer M5 404 and a height of memory cell structure 401 exclusive of conductive plug 420. The height of memory cell structure 401 is equal to a depth F of via 415, plus a thickness T of via liner 418, plus a height C of fill material 416 above via liner 418, or F+T+C. Height, H, of conductive plug 420 can therefore be determined from:

$$H_{PLUG\ 420} = D - (F+T+C).$$

Utilizing this relationship, and on condition that D is greater than (F+T+C), memory cell structure 401 can be constructed between metal layers of a semiconductor device without affecting predetermined inter-metal layer distances. Accordingly, predetermined values for a first distance A between metal layer M4 402 and metal layer M4 410, a second distance D between metal layer M4 410 and metal layer M5 404, as well as a third distance E between metal layer M3 402 and metal layer M5 404 can be unaffected by fabrication of memory cell structure 401. This provides a significant advancement to the state of the art, because changing inter-metal layer thicknesses can change inter-metal layer capacitance values of a device, which can in turn void electrical models of a chip. Traditionally, the electrical models would have to be evaluated and remodeled to construct a memory cell among backend metal layers, adding significant overhead to semiconductor engineering and fabrication costs. Memory cell structure 401 can be constructed without these consequences, enabling integration of embedded memory in an integrated circuit without substantial impact to design, development and fabrication overhead costs.

In further embodiments, memory cell structure 401 can be a resistive-switching, two-terminal memory cell with a first electrode at M5 404 and a second electrode at M4 410. In contrast to the oblique-oriented memory cells 422A, 422B of FIG. 4, supra, memory cell structure 401 can be a vertically-oriented (or substantially vertically-oriented) device, in which minimum feature size of memory cell structure 401 is independent of thickness of metal layers M4 410 and M5 404, and dependent instead on width (e.g., left and right across the page) or depth (e.g., in and out of the page) of memory cell structure 401, whichever is smaller. Electrical continuity of vertically-oriented memory cell structure 401 is also oriented vertically, from a first memory cell electrode at the portion of metal layer M5 404 connected to conductive plug 420, to a second memory cell electrode at a portion of metal layer M4 410 in contact with via 415.

Materials for memory cell structure 401 can be substantially similar to those given for via-type device 414 of FIG. 4, supra. For instance, via liner 418 can be selected from a suitable resistive-switching material, as described herein. Further, fill material 416 can be selected from a suitable active metal, and conductive plug 420 can be a suitable electrical conductor. Moreover, memory cell structure 401 can include one or more additional materials representing a selector device, as mentioned above with respect to FIG. 4. Further, memory cell structure 401 can comprise one or more additional layers such as a barrier layer (e.g., to mitigate oxygen contamination, or other catalyst), a diffusion mitigation layer (e.g., to mitigate movement of diffusive materials, such as Cu), an adhesion layer (e.g., to promote good contact between other layers), or the like, or suitable combinations of the foregoing.

Figure 5:
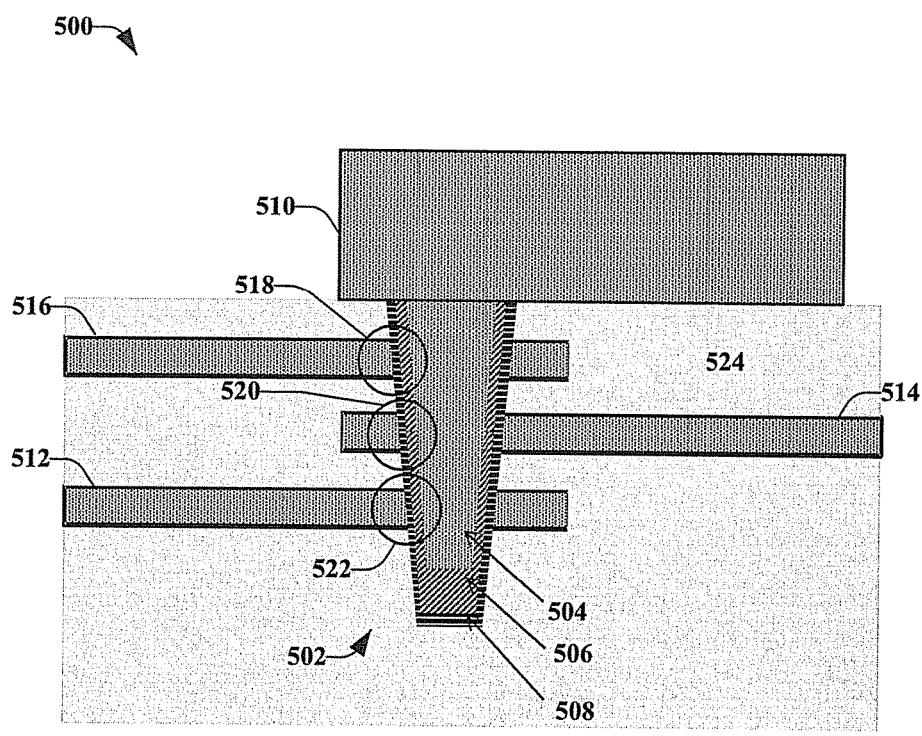
FIG. 5 depicts an example, non-liming schematic representation of a via that is shared across multiple word lines, according to an aspect.

FIG. 5 depicts an example, non-limiting schematic representation 500 of a via that is shared across multiple word lines (e.g., metal layers) of a CMOS device, according to an aspect. In various embodiments, multiple memory devices are formed in approximately a stacked configuration (e.g., one layer on top of another). Representative memory devices 518, 520, and 522 are circled in FIG. 5. In some embodiments, a smaller memory chip, a higher memory density, or a suitable combination thereof are thus enabled. The via 502 can include a resistive switching material 508 that can be in contact with a first word-line 512 (word-line 1), a second word-line 514 (word-line 2), and a third word-line 516 (word-line 3). In various embodiments, the word lines may be fabricated with a conductor such as Al, Cu, or the like, along with one or more barrier material layers, e.g. Ti, TiN, TaN, W, W—Ti, or the like. The resistive switching material 508 can include SiOx, for example. Further, a barrier material 506, can be located between the resistive switching material 508 and an active metal layer 504. The resistive switching material 508 can be TiOx, AlOx, or combinations thereof. The active metal layer 504 can include various material that includes, but is not limited to, Al, Al and Cu, Al with TiN, Al with Ti or TiN, TiN, Al and Cu or TiN, or suitable combinations thereof. In other embodiments, 508 may be a barrier material layer, 506 may be a resistive switching layer, 504 may be an active metal material, and a barrier material layer (not shown) overlies 504 and contacts bit-line 510.

Figure 6:
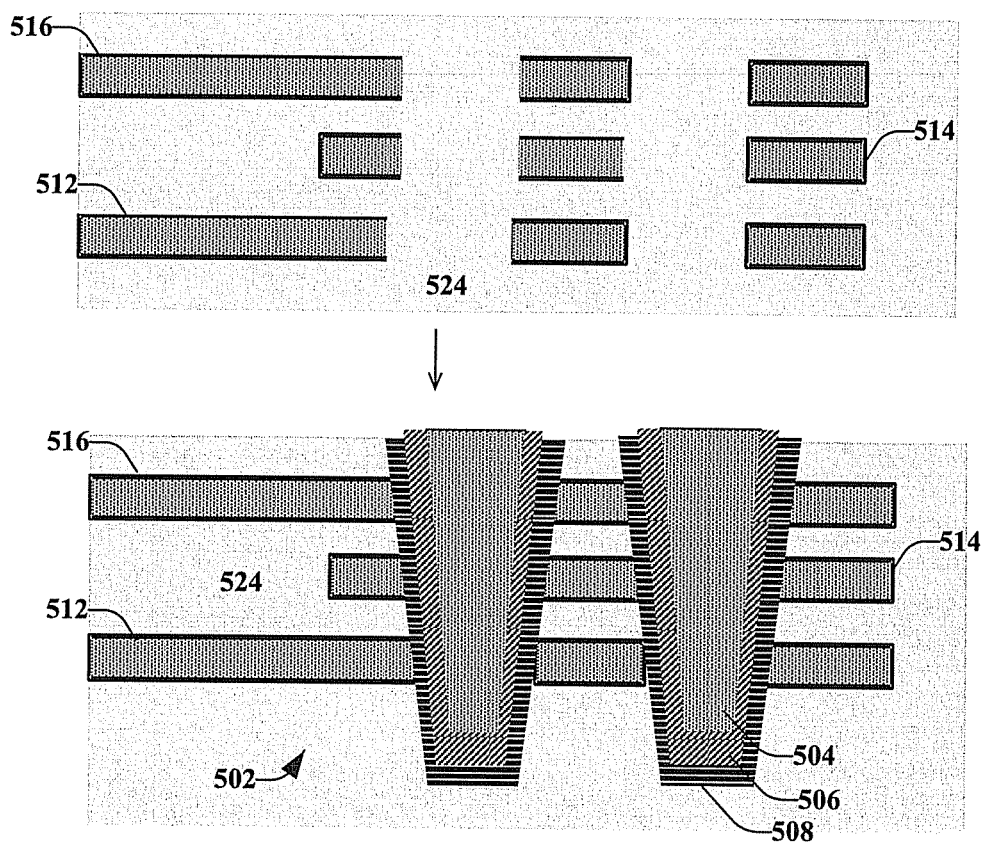
FIG. 6 depicts formation of the via device through multiple word lines, according to an aspect.

A top portion of the via 502 (and the resistive switching material 508, barrier material 506, and active metal layer 504) can contact a bit-line 510. With reference also to FIG. 6, which illustrates formation of the via device through multiple word lines, according to an aspect. In some embodiments of the present invention, the via 502 is etched through dielectric material 524 and through the first word-line 512, the second word-line 514, and the third word-line 516. The via 502 can be etched using various fabrication processes, such as a reactive ion etch, for example.

In other embodiments, the first word-line 512, the second word-line 514, and the third word-line 516 are broken or pre-patterned, as illustrated in FIG. 6. In other words, the word lines are deliberately missing in the vicinity of where via 502 is to be formed. Subsequently, to etch via 502, a simple oxide chemistry (e.g., wet etch) may be used. A result of such an etch is to expose (e.g., the side walls of) the "broken" word lines. Subsequently, resistive switching material 508 may be deposited within via 502 in contact with the exposed sidewalls of the "broken word lines.

Such embodiments can reduce etch complexity and metal sidewall deposition (e.g., referring to a vertical or oblique-angled surface exposed by breaking a word line in conjunction with formation of via 502). In some embodiments, via 502 can form one or more two-terminal memory cells oriented along a horizontal, or substantially horizontal direction relative to a length of word lines 512, 514, 516, utilizing metal oblique-angle surfaces as a top or bottom terminal. See, for example, formation and utilization of oblique angle two-terminal memory cells in U.S. patent application Ser. No. 14/194,499, entitled "THREE-DIMENSIONAL OBLIQUE TWO-TERMINAL MEMORY WITH ENHANCED ELECTRIC FIELD," and filed Feb. 28, 2014, assigned to the assignee hereof and expressly incorporated by reference in its entirety and for all purposes. The bottom of FIG. 6 illustrates the etch via, which can use oxide etch chemistry, according to an aspect. The via can result in exposed sidewall portions (e.g., having vertical surface(s), substantially vertical surface(s), oblique angle surfaces(s), and so on) of respective ones of the word line layers.

In view of the exemplary diagrams described above, process methods that can be implemented in accordance with the disclosed subject matter will be better appreciated with reference to following flow charts. While for purposes of simplicity of explanation, the methods are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks are necessarily required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

Figure 7:
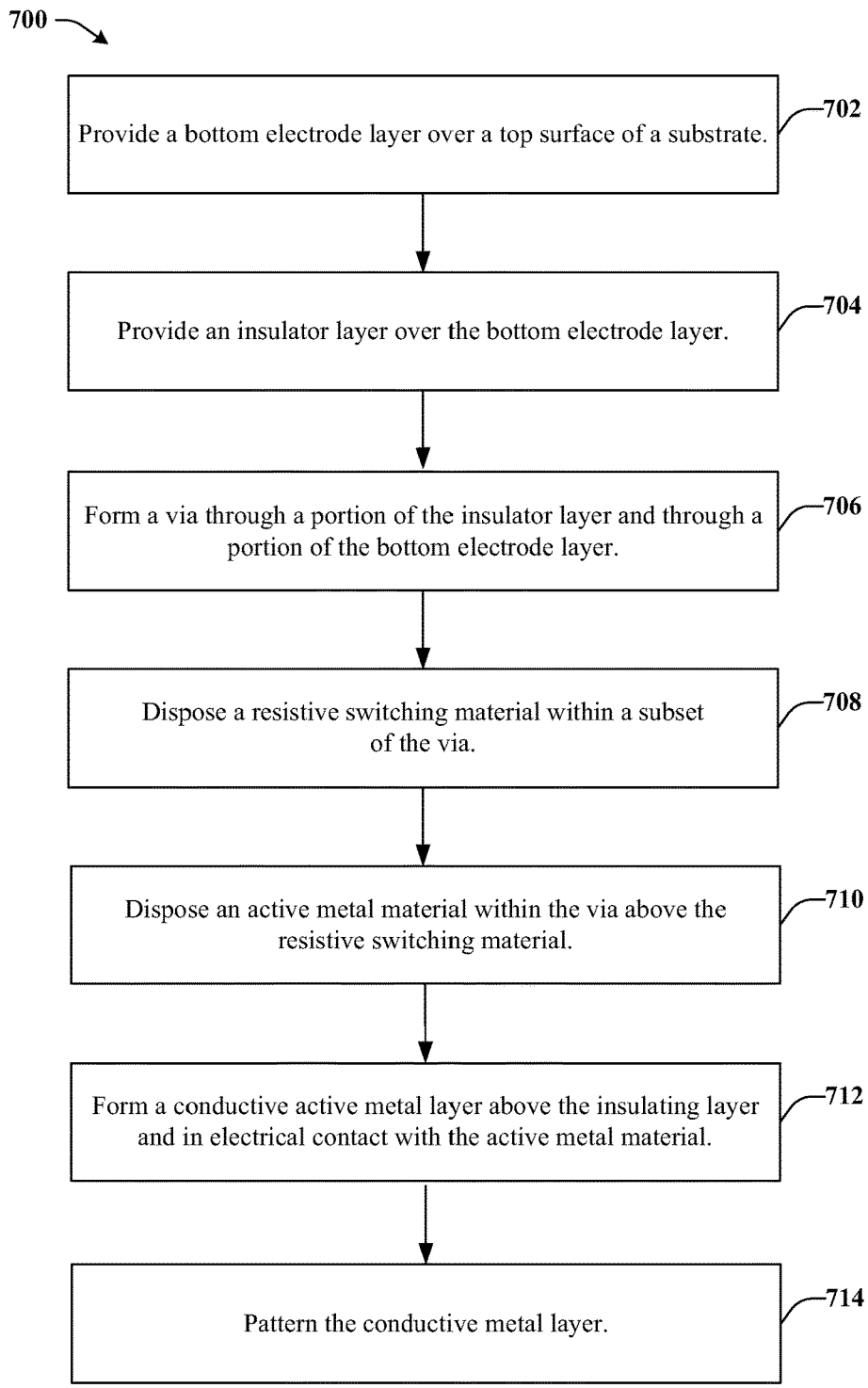
FIG. 7 illustrates a flowchart of an example, non-limiting method for fabricating a memory device, according to alternative or additional aspects of the subject disclosure.

FIG. 7 illustrates a flowchart of an example, non-limiting method 700 for fabricating a memory device, according to alternative or additional aspects of the subject disclosure. Initially, a bottom electrode layer (e.g., M4 metal layers 410 of FIG. 4) is provided over a top surface of a substrate (e.g., M3 metal layers 402 of FIG. 4). The bottom electrode layer may be a metal such as aluminum, copper, or the like). In an example, the substrate can be a CMOS-related substrate. For example, in one embodiment, a substrate could be provided that includes one or more CMOS devices formed therein. In an alternative embodiment, the one or more CMOS devices can be fabricated on, or within, the substrate. In another embodiment, the substrate can be provided with one or more CMOS devices formed therein and one or more additional CMOS devices are fabricated on, or within, the substrate.

Above the substrate (e.g., M3 metal layers 402 of FIG. 4) can be an insulator layer (e.g. first insulating layer 408 of FIG. 4) and the bottom electrode can be provided above the insulator layer. The insulator layer (or dielectric layer) can have a dimension or height "A", as illustrated in FIG. 4.

Forming the bottom electrode can include choosing a material for the bottom electrode selected from W, Al, TiN, W—Ti, TiN, TaN, doped polysilicon, doped polycrystalline SiGe, polycrystalline silicon-container material, or combinations thereof, step 702. At 704, an insulator layer (e.g., second insulating layer 412 of FIG. 4) is provided over the bottom electrode. According to an embodiment, the insulator layer can be an interlayer dielectric that may include a field oxide, or the like.

At 706, a via (e.g., via 414 of FIG. 4) is formed through a portion of the insulator layer and through a portion of the bottom electrode layer. For example, a dielectric layer ("B" of FIG. 4) can be deposited within the via. Further, the via extends through the bottom electrode (e.g., M4 metal layer 410 of FIG. 4) such that a "sidewall" type structure is formed. In accordance with an implementation, the via can be shared across multiple word lines (e.g., M4's). A resistive switching material is disposed within a subset of the via device, at 708. For example, the resistive switching material can be formed as a liner of material selected from an undoped amorphous silicon material, SiOx, SiOx or TiOx, SiOx or AlOx, or combinations thereof. In various embodiments, the resistive switching material includes a plurality of defects.

Further, a remaining subset of the via (not including the subset) can be partially or fully backfilled with an active metal material, at 710. It is noted that the active metal layer typically also "breaks" the bottom plane (e.g. indicated by line "F" in FIG. 4). Further dielectric material (e.g., denoted as "C" in FIG. 4) can be formed.

The active metal can be a material such as Al, Al and Cu, Al with TiN, Al with Ti or TiN, TiN, Al and Cu or TiN, or combinations thereof. For example, backfilling the remaining subset of the via device can include partially or completely filling the via device with the active material.

An conductive plug layer is formed at 712, above the insulating layer and the via device. At 714, the conductive metal layer can be planarized, formed, and patterned. Forming the active metal layer can include choosing a material selected from W, Al or TiN, or combinations thereof. Additionally, a metallic plug, e.g., W, TiN, or the like may be formed between the via device and the active metal layer.

A conductive metal layer is formed at 712, above the insulating layer and the via device. At 714, the conductive metal layer can be planarized, formed, and patterned. Forming the conductive metal layer can include choosing a material selected from W, Al or TiN, or combinations thereof. Additionally, a metallic plug, e.g., W, TiN, or the like may be formed between the via device and the active another metal layer (e.g., M5 404 of FIG. 4).

According to an implementation, the active metal within the via, the resistive switching material, and the bottom electrode form a resistive memory cell that scales at least in part as a function of a thickness of the bottom electrode layer. The scaling can be independent of a minimum feature size of integrated circuit fabrication equipment (e.g., tooling) employed for the fabricating.

In various embodiments of the subject disclosure, disclosed memory architectures can be employed as a stand-alone or integrated embedded memory device with a CPU or microcomputer. Some embodiments can be implemented, for instance, as part of a computer memory (e.g., random access memory, cache memory, read-only memory, storage memory, or the like). Other embodiments can be implemented, for instance, as a portable memory device. Examples of suitable portable memory devices can include removable memory, such as a secure digital (SD) card, a universal serial bus (USB) memory stick, a compact flash (CF) card, or the like, or suitable combinations of the foregoing. (See, e.g., FIGS. 8 and 9, infra).

NAND FLASH is employed for compact FLASH devices, USB devices, SD cards, solid state drives (SSDs), and storage class memory, as well as other form-factors. Although NAND has proven a successful technology in fueling the drive to scale down to smaller devices and higher chip densities over the past decade, as technology scaled down past 25 nanometer (nm) memory cell technology, several structural, performance, and reliability problems became evident. Such considerations have been addressed by the disclosed aspects.

Figure 8:
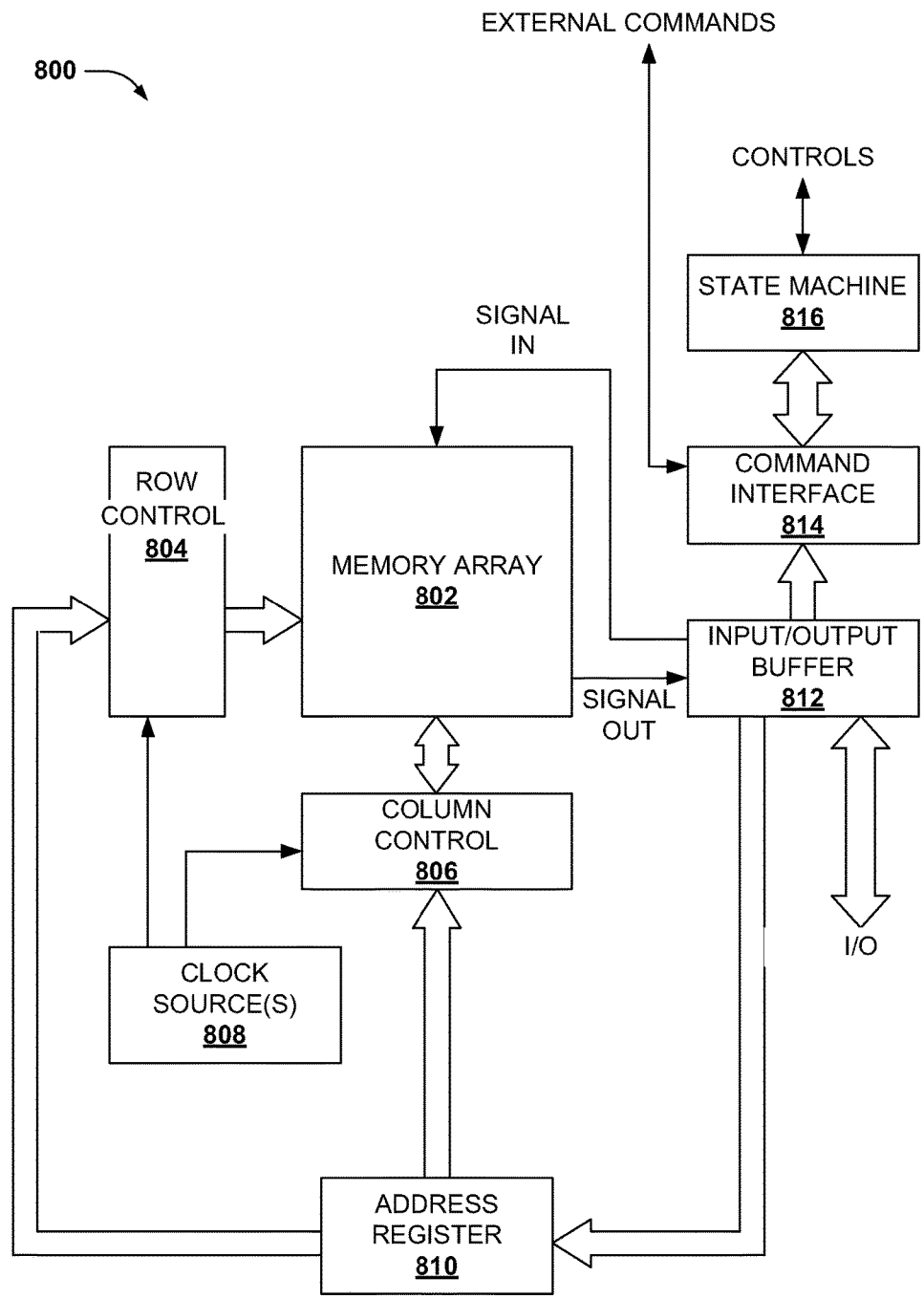
FIG. 8 depicts a block diagram of a sample operating environment for facilitating implementation of one or more disclosed embodiments.

In order to provide a context for the various aspects of the disclosed subject matter, FIG. 8, as well as the following discussion, is intended to provide a brief, general description of a suitable environment in which various aspects of the disclosed subject matter can be implemented or processed. While the subject matter has been described above in the general context of semiconductor architectures and process methodologies for fabricating and operating such architectures, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer (e.g., computer 902 of FIG. 9, infra), which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the subject innovation can be practiced on stand-alone electronic devices, such as a memory card, Flash memory module, removable memory, or the like. In a distributed computing environment, program modules can be located in both local and remote memory storage modules or devices.

FIG. 8 illustrates a block diagram of an example operating and control environment 800 for a memory cell array 802 according to aspects of the subject disclosure. In at least one aspect of the subject disclosure, memory cell array 802 can comprise a variety of memory cell technology. Particularly, memory cell array 802 can comprise resistive switching memory cells having rectifier characteristics, as described herein.

A row controller 804 or a column controller 806 can be formed adjacent to memory cell array 802. Moreover, column controller 806 can be electrically coupled with bit lines of memory cell array 802. Column controller 806 can control respective bitlines, applying suitable program, erase or read voltages to selected bitlines.

The row controller 804 can be formed adjacent to column controller 806, and electrically connected with word lines of memory cell array 802. Row controller 804 can select particular rows of memory cells with a suitable selection voltage. Moreover, row controller 804 can facilitate program, erase or read operations by applying suitable voltages at selected word lines.

A clock source(s) 808 can provide respective clock pulses to facilitate timing for read, write, and program operations of row controller 804 and column controller 806. Clock source(s) 808 can further facilitate selection of word lines or bit lines in response to external or internal commands received by operating and control environment 800. An input/output buffer 812 can be connected to an external host apparatus, such as a computer or other processing device (not depicted, but see, for example, computer 902 of FIG. 9, infra) by way of an I/O buffer or other I/O communication interface. Input/output buffer 812 can be configured to receive write data, receive an erase instruction, output readout data, and receive address data and command data, as well as address data for respective instructions. Address data can be transferred to row controller 804 and column controller 806 by an address register 810. In addition, input data is transmitted to memory cell array 802 via signal input lines, and output data is received from memory cell array 802 via signal output lines. Input data can be received from the host apparatus, and output data can be delivered to the host apparatus via the I/O buffer.

Commands received from the host apparatus can be provided to a command interface 814. Command interface 814 can be configured to receive external control signals from the host apparatus, and determine whether data input to the input/output buffer 812 is write data, a command, or an address. Input commands can be transferred to a state machine 816.

State machine 816 can be configured to manage programming and reprogramming of memory cell array 802. State machine 816 receives commands from the host apparatus via input/output buffer 812 and command interface 814, and manages read, write, erase, data input, data output, and similar functionality associated with memory cell array 802. In some aspects, state machine 816 can send and receive acknowledgments and negative acknowledgments regarding successful receipt or execution of various commands.

To implement read, write, erase, input, output, etc., functionality, state machine 816 can control clock source(s) 808. Control of clock source(s) 808 can cause output pulses configured to facilitate row controller 804 and column controller 806 implementing the particular functionality. Output pulses can be transferred to selected bit lines by column controller 806, for instance, or word lines by row controller 804, for instance.

In connection with FIG. 8, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 9:
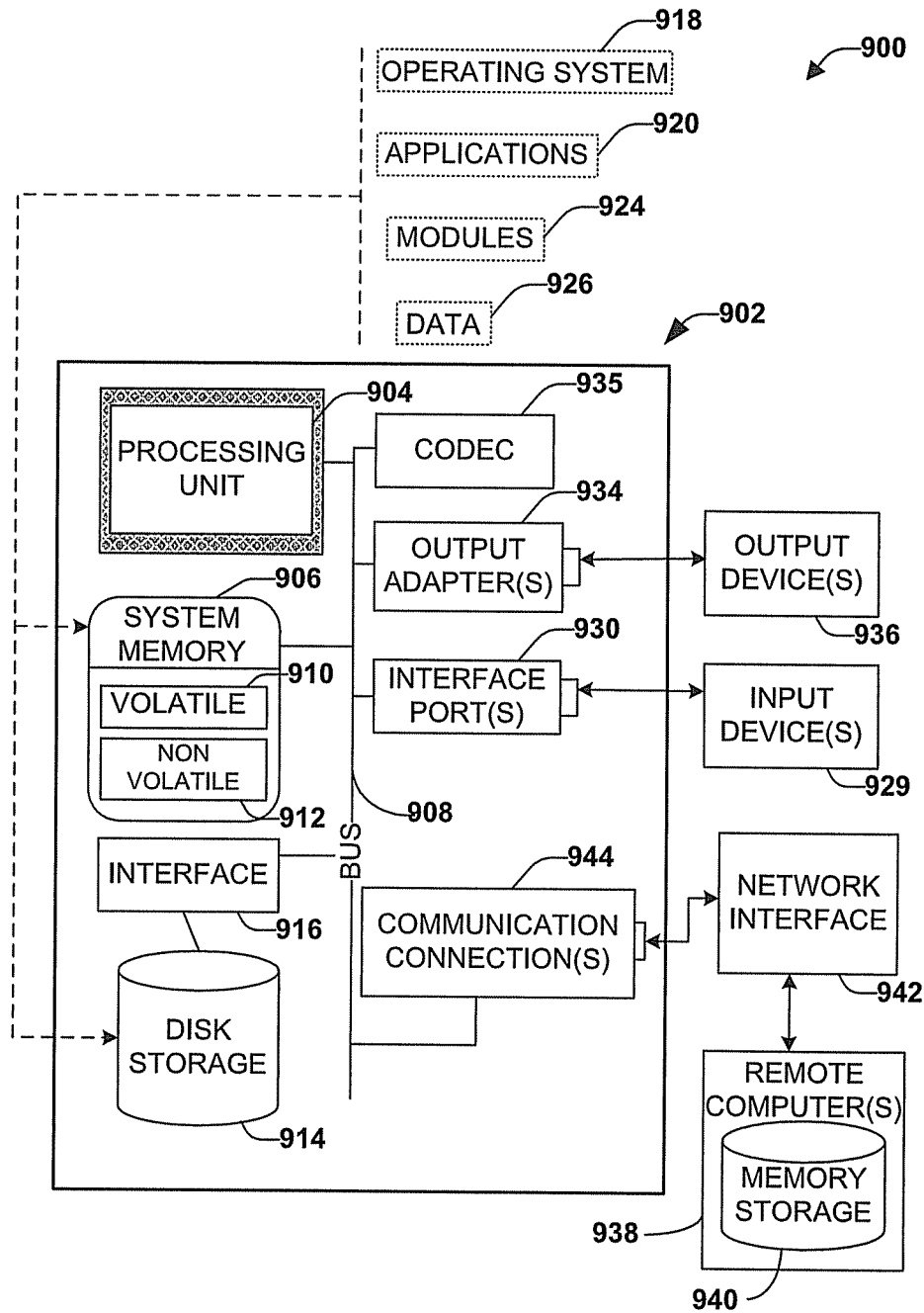
FIG. 9 illustrates a block diagram of an example computing environment that can be implemented in conjunction with various embodiments.

With reference to FIG. 9, a suitable operating environment 900 for implementing various aspects of the claimed subject matter includes a computer 902. The computer 902 includes a processing unit 904, a system memory 906, a codec 935, and a system bus 908. The system bus 908 couples system components including, but not limited to, the system memory 906 to the processing unit 904. The processing unit 904 can be any of various available processors. Dual microprocessors and other multiprocessor architectures also can be employed as the processing unit 904.

The system bus 908 can be any of several types of bus structure(s) including the memory bus or memory controller, a peripheral bus or external bus, or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 906 includes volatile memory 910 and non-volatile memory 912, which can employ one or more of the disclosed memory architectures, in various embodiments. The basic input/output system (BIOS), containing the basic routines to transfer information between elements within the computer 902, such as during start-up, is stored in non-volatile memory 912. In addition, according to present innovations, codec 935 may include at least one of an encoder or decoder, wherein the at least one of an encoder or decoder may consist of hardware, software, or a combination of hardware and software. Although, codec 935 is depicted as a separate component, codec 935 may be contained within non-volatile memory 912.

By way of illustration, and not limitation, non-volatile memory 912 can include read only memory (ROM), programmable ROM (PROM), electrically programmable ROM (EPROM), electrically erasable programmable ROM (EEPROM), or Flash memory. Non-volatile memory 912 can employ one or more of the disclosed memory architectures, in at least some disclosed embodiments. Moreover, non-volatile memory 912 can be computer memory (e.g., physically integrated with computer 902 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 910 includes cache memory, or random access memory (RAM), which acts as external cache memory, and can also employ one or more disclosed memory architectures in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM), and so forth.

Computer 902 may also include removable/non-removable, volatile/non-volatile computer storage medium. FIG. 9 illustrates, for example, disk storage 914. Disk storage 914 includes, but is not limited to, devices such as a magnetic disk drive, solid state disk (SSD) floppy disk drive, tape drive, Jaz drive, Zip drive, LS-100 drive, flash memory card, or memory stick. In addition, disk storage 914 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 914 to the system bus 908, a removable or non-removable interface is typically used, such as interface 916. It is appreciated that disk storage 914 can store information related to a user. Such information might be stored at or provided to a server or to an application running on a user device. In one embodiment, the user can be notified (e.g., by way of output device(s) 936) of the types of information that are stored to disk storage 914 or transmitted to the server or application. The user can be provided the opportunity to opt-in or opt-out of having such information collected or shared with the server or application (e.g., by way of input from input device(s) 928).

It is to be appreciated that FIG. 9 describes software that acts as an intermediary between users and the basic computer resources described in the suitable operating environment 900. Such software includes an operating system 918. Operating system 918, which can be stored on disk storage 914, acts to control and allocate resources of the computer 902. Applications 920 take advantage of the management of resources by operating system 918 through program modules 924, and program data 926, such as the boot/shutdown transaction table and the like, stored either in system memory 906 or on disk storage 914. It is appreciated that the claimed subject matter can be implemented with various operating systems or combinations of operating systems.

A user enters commands or information into the computer 902 through input device(s) 928. Input devices 928 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 904 through the system bus 908 via interface port(s) 930. Interface port(s) 930 include, for example, a serial port, a parallel port, a game port, and a universal serial bus (USB). Output device(s) 936 use some of the same type of ports as input device(s) 928. Thus, for example, a USB port may be used to provide input to computer 902 and to output information from computer 902 to an output device 936. Output adapter 934 is provided to illustrate that there are some output devices, such as monitors, speakers, and printers, among other output devices, which require special adapters. The output adapter 934 can include, by way of illustration and not limitation, video and sound cards that provide a means of connection between the output device 936 and the system bus 908. It should be noted that other devices or systems of devices provide both input and output capabilities such as remote computer(s) 938.

Computer 902 can operate in a networked environment using logical connections to one or more remote computers, such as remote computer(s) 938. The remote computer(s) 938 can be a personal computer, a server, a router, a network PC, a workstation, a microprocessor based appliance, a peer device, a smart phone, a tablet, or other network node, and typically includes many of the elements described relative to computer 902. For purposes of brevity, only a memory storage device 940 is illustrated with remote computer(s) 938. Remote computer(s) 938 is logically connected to computer 902 through a network interface 942 and then connected via communication connection(s) 944. Network interface 942 encompasses wire or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks such as Integrated Services Digital Networks (ISDN) and variations thereon, packet switching networks, and Digital Subscriber Lines (DSL).

Communication connection(s) 944 refers to the hardware/software employed to connect the network interface 942 to the system bus 908. While communication connection 944 is shown for illustrative clarity inside computer 902, it can also be external to computer 902. The hardware/software necessary for connection to the network interface 942 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, and so on) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips, and so on), optical disks (e.g., compact disk (CD), digital versatile disk (DVD), and so forth), smart cards, and flash memory devices (e.g., card, stick, key drive, and so on). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical or magnetic signals capable of being stored, transferred, combined, compared, or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts or events of the various processes.

What is claimed is:

1. A memory device, comprising:
    a first metal layer formed over a substrate comprising one or more complementary metal-oxide semiconductor devices; and
    a via device that contacts at least a portion of the first metal layer and that contacts or electrically contacts at least another portion of a second metal layer, wherein the first metal layer comprises a first thickness having an edge thereof that serves as an electrode for a memory cell formed by the via device, wherein the memory cell scales as a function of the first thickness and at least in part independent of a minimum feature size of the memory device, wherein the via device is filled at least in part with a switch layer liner and with a material selected from a group consisting essentially of: Al, Al and Cu, Al with TiN, Al with Ti or TiN, TiN, Al and Cu or TiN, a suitable compound of Al, Cu or Ti, and a suitable alloy of Al, Cu, or Ti, the material serving as a second electrode for the memory cell formed by the via device, wherein the minimum feature size of the memory device is as large as 248 nanometers and the memory cell scales at least to a 20 nanometer device.

2. The memory device of claim 1, wherein the memory cell scales to a limit defined at least in part by a dimension of the via device.

3. The memory device of claim 1, wherein the memory cell scales to a limit defined by the first thickness equal to about 5 nanometers.

4. The memory device of claim 1, wherein the via device is further filled with at least one select layer liner, and wherein the select layer liner or the switch layer liner is formed of a material selected from a group consisting of: SiOx, SiOx with TiOx, SiOx with AlOx, TiOx, AlOx, or a suitable combination thereof.

5. The memory device of claim 1, wherein the via device comprises a collar that comprises conducting material.

6. The memory device of claim 1, wherein the first metal layer is formed of a material selected from W, Al, Cu, TaN, Ti, TiN, W—Ti, or a suitable combination thereof and the second metal layer is formed of a material selected from a group consisting of: W, Al, Cu, TaN, Ti, TiN, W—Ti, or a suitable combination thereof.

7. A memory device, comprising:
    a substrate that comprises one or more complementary metal-oxide semiconductor devices;
    a first metal layer formed over the substrate; and
    a via device that contacts at least a portion of the first metal layer and that contacts or electrically contacts at least another portion of a second metal layer, wherein the first metal layer comprises a first thickness having an edge thereof that operates as an electrode for a memory cell formed by the via device, and wherein the memory cell scales as a function of the first thickness and at least in part independent of a minimum feature size of the memory cell, wherein the via device is filled at least in part with a resistive switching material liner and with a material selected from a group consisting essentially of: Al, Al and Cu, Al with TiN, Al with Ti or TiN, TiN, Al and Cu or TiN, a suitable compound of Al, Cu or Ti, and a suitable alloy of Al, Cu, or Ti, the material serving as a second electrode for the memory cell formed by the via device, wherein the memory cell scales to a limit defined by the first thickness equal to about 5 nanometers.

8. The memory device of claim 7, wherein the limit defined by the first thickness is further defined at least in part by a dimension of the via device.

9. The memory device of claim 7, wherein another minimum feature size of an integrated circuit fabrication equipment is no larger than 248 nanometers, and the memory cell scales to the first thickness equal to about 5 nanometers.

10. The memory device of claim 7, wherein the via device is filled in further part with a select layer liner.

11. The memory device of claim 7, wherein the via device comprises a collar that comprises conducting material.

12. A memory device, comprising:
    a via formed within an insulating material between a first metal layer of an integrated circuit and a second metal layer of the integrated circuit, the via exposing a surface of the first metal layer through the insulating material;
    a via liner material deposited as a thin film with a relatively uniform thickness over a surface of the insulating material exposed by the via, the via liner material is an electrically resistive material having a molecular structure selected to facilitate trapping of conductive particles within the via liner material at a potential lower in magnitude than a program potential for the memory device, wherein the via liner material comprises at least one select layer and at least one switch layer;
    a fill material deposited over the via liner and over the via formed within the insulating material, the fill material comprising the conductive particles for which the electrically resistive material facilitates the trapping within the molecular structure of the via liner at the potential lower in magnitude than the program potential; and
    a contact material that provides electrical continuity between the fill material and the second metal layer.

13. The memory device of claim 12, wherein the at least one switch layer of the via liner material is a material selected from a group consisting of: SiOx, SiOx with TiOx, SiOx with AlOx, TiOx, AlOx, and a suitable combination thereof.

14. The memory device of claim 12, wherein the fill material is a material selected from a group consisting essentially of: Al, Al and Cu, Al with TiN, Al with Ti or TiN, TiN, Al and Cu or TiN, suitable compounds of Al, Cu or Ti, and suitable alloys of Al, Cu, or Ti.

15. The memory device of claim 12, wherein the fill material comprises at least two materials arranged along a direction at least in part perpendicular to the surface of the first metal layer exposed through the insulating material.

16. The memory device of claim 12, wherein a portion of the via liner or a portion of the fill material serves as a collar in orientation to the via formed within the insulating material and to a second portion of the via liner or the fill material within the via, the portion having a larger width relative to the second portion.

17. The memory device of claim 1, further comprising a conductive plug of material coupled to the via device and to the other portion of the second metal layer.

18. The memory device of claim 7, further comprising a conductive plug in contact with the second electrode of the memory cell and the second metal layer, wherein the via device electrically contacts the second metal layer by way of the conductive plug.

19. The memory device of claim 7, wherein the via device intersects the first metal layer, and the first thickness of the first metal layer defines a contact area between the electrode and a switching material of the memory cell.

20. The memory device of claim 12, wherein the via liner material is deposited in contact with the surface of the first metal layer exposed by the via through the insulating material.

\* \* \* \* \*